(12) United States Patent
Kodama et al.

(10) Patent No.: US 7,064,382 B2
(45) Date of Patent: Jun. 20, 2006

(54) NONVOLATILE MEMORY AND NONVOLATILE MEMORY MANUFACTURING METHOD

(75) Inventors: Noriaki Kodama, Kanagawa (JP); Kohji Kanamori, Kanagawa (JP); Junichi Suzuki, Kanagawa (JP); Teiichirou Nishizaka, Kanagawa (JP); Yasuhide Den, Kanagawa (JP); Shinji Fujieda, Tokyo (JP); Akio Toda, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 0 days.

(21) Appl. No.: 11/074,064

(22) Filed: Mar. 8, 2005

(65) Prior Publication Data

US 2005/0199945 A1    Sep. 15, 2005

(30) Foreign Application Priority Data

Mar. 9, 2004  (JP) ............................. 2004-065882
Jun. 30, 2004 (JP) ............................. 2004-194150

(51) Int. Cl.
*H01L 29/788* (2006.01)

(52) U.S. Cl. .................. 257/316; 257/324; 257/326
(58) Field of Classification Search ................ 257/316, 257/324, 326
See application file for complete search history.

(56) References Cited

U.S. PATENT DOCUMENTS 6,977,408 B1* 12/2005 Lin et al. ..................... 257/315
2003/0181005 A1* 9/2003 Hachimine et al. .......... 438/231
2005/0051855 A1* 3/2005 Kanegae et al. ............. 257/410

FOREIGN PATENT DOCUMENTS

JP          8-31962          2/1996

* cited by examiner

*Primary Examiner*—Trung Dang
(74) *Attorney, Agent, or Firm*—McGinn IP Law Group, PLLC

(57) ABSTRACT

A nonvolatile memory device includes source and drain regions formed in a semiconductor substrate, and an insulating film formed on a channel region between the source region and the drain region in the semiconductor substrate. The nonvolatile memory device also includes a dielectric film formed above the channel region to store electric charge, and a control gate formed on the dielectric film. Compressive stress in the channel region is equal to or less than 50 MPa.

20 Claims, 36 Drawing Sheets

NONVOLATILE MEMORY AND NONVOLATILE MEMORY MANUFACTURING METHOD

BACKGROUND OF THE INVENTION

1. Field of the Invention

The present invention relates to a nonvolatile memory device and a nonvolatile memory device manufacturing method, particularly to a nonvolatile memory device, in which a holding characteristic of a memory cell is improved, and a nonvolatile memory device manufacturing method.

2. Description of the Related Art

A nonvolatile memory device is known which has a nonvolatile characteristic that once stored data is not erased even if a power supply is turned off as long as the data is not erased or rewritten. As a cell structure of the nonvolatile memory device, a one-transistor-type memory cell structure is known. In case of this cell structure, an electric-charge storage film and a control gate are formed on a gate insulating film formed on a semiconductor substrate to have a structure laminated in this order. Electric charge stored in the electric-charge storage film corresponds to stored data. The one-transistor-type memory cell structure is classified based on the structure of the electric-charge storage film. That is, when the electric-charge storage film has a structure in which an interlayer insulating film is formed on a semiconductor region in which impurities are introduced, this structure is referred to as a floating-gate-type cell. When a structure in which a interlayer insulating film and an insulating film having many electric-charge trapping centers are laminated in order, this structure is referred to as MONOS (Metal-Oxide-Nitride-Oxide-Semiconductor)-type cell. Also, when an electric-charge storage film has a structure in which an interlayer insulating film and an insulating film containing fine particles of the semiconductor are laminated in order, this structure is referred to as a nano-crystal-type cell. The insulating film containing fine particles of the semiconductor may further contain fine particles of metal. Also, when an electric-charge storage film is formed of ferroelectric substance or from a laminate film of a ferroelectric substance film and a metal electrode, this structure is referred to as an MF(M)IS (Metal-Ferroelectric-(Metal)-Insulator-Semiconductor)-type cell. In case of the nonvolatile memory device using the MFMIS-type cell, the direction of the spontaneous polarization of the ferroelectric substance included in an electric-charge storage layer corresponds to the data to be stored.

In these nonvolatile memory devices having the one-transistor-type memory cell structure, data write or read is commonly carried out by using a source, a drain and a control gate having the laminated structure formed on a semiconductor substrate around the cell structure and by controlling current flowing through a channel region between the source and the drain. Therefore, to improve the performance and reliability of the nonvolatile memory device having the structure, it is essential to sufficiently control physical properties of the channel region and the gate insulating film in the manufacturing process of the nonvolatile memory device.

Also, miniaturization of a memory cell is pursued in accordance with requests for increase of a memory device in capacity and decrease of the memory in size. According to the requests, a stress due to device separation influences a channel region. In case of the device separation by a shallow trench, an insulating film embedded in the trench applies compressive stress to the channel region in the direction parallel to the substrate surface. When the strong compressive stress is applied to the channel region, mobility of electrons decrease. In this case, because the on/off ratio of the current of the memory cell decreases, it is necessary to increase the electric charge quantity taken out from or injected into the electric-charge storage film through the gate oxide film. If the electric charge quantity to be taken out from or injected into the electric-charge storage layer increases, deterioration of the gate oxide film becomes extreme, on current is decreased and a holding characteristic of the memory cell is deteriorated. The compressive stress due to device separation in the shallow trench is similarly applied to the gate insulating film in addition to the channel region. When the strong compressive stress is applied to the gate oxide film, the activation energy of electron traps present in the gate oxide film is decreased. This means that electrons trapped in the electron traps are easily discharged, and therefore, the threshold voltage of a transistor is easily changed. This is a factor of holding characteristic deterioration.

Though the influence of the compressive stress on the channel region and gate insulating film is described above, the tensile stress also influences the memory cell. When the strong compressive stress is applied to the channel region and the gate insulating film, the coupling between dangling bonds and hydrogen atoms present in the interface between the gate insulating film and the semiconductor substrate is easily disconnected. Therefore, under the strong compressive stress, the number of interface levels in the interface between the gate insulating film and the semiconductor substrate increases, compared with a case of no stress. This means that the change of the threshold voltage of the transistor becomes large through the recovery of interface levels under the strong compressive stress. Therefore, the strong compressive stress is one of factors of deterioration of the holding characteristic.

In this way, in order to restrain the holding characteristic deterioration and to realize a high-reliability nonvolatile memory device, a technique is demanded which decreases the absolute value of the semiconductor substrate stress in the channel region. Such a technique makes it possible to increase the on/off ratio of the current of the memory cell, to restrain deterioration of the gate insulating film and to keep the characteristic of the memory cell. As a result, it becomes possible to improve the number of times of the rewriting operation and to realize the cell characteristic suitable for a multi-valued memory.

In conjunction with the above description, a manufacturing method of a nonvolatile semiconductor memory is disclosed in Japanese Laid Open Patent application (JP-A-Heisei 8-31962). In this conventional example, it is aimed to form an interlayer insulating film not so as to deteriorate a gate insulating film. The nonvolatile semiconductor memory of the conventional example has a floating gate electrode is formed on a semiconductor substrate of a first conductivity type through a gate insulating film. A control gate electrode is formed on the floating gate electrode through an interlayer insulating film so that at least a part of the control gate electrode is laminated on the floating gate electrode. Second conductivity type source and drain regions are formed separately from each other in the semiconductor substrate. As the interlayer insulating film, a single-layer oxide silicon film is formed by a chemical vapor deposition method. In this conventional example, it is described that deterioration of the gate oxide film is decreased because the stress of the interlayer insulating film is relaxed.

SUMMARY OF THE INVENTION

An object of the present invention is to provide a nonvolatile memory device in which the absolute value of a stress of a semiconductor substrate in a channel region can be restrained, and a manufacturing method of the nonvolatile memory device.

Another object of the present invention if to provide a nonvolatile memory device in which an on/off ratio of current of a memory cell can be improved, and a manufacturing method of the nonvolatile memory device.

Still another object of the present invention is to provide a nonvolatile memory device in which deterioration of a gate oxide film can be restrained, and a manufacturing method of the nonvolatile memory device.

It is also another object of the present invention to provide a nonvolatile memory device in which a characteristic of a memory cell can be kept, and the number of times of a rewriting operation is increased, and a manufacturing method of the nonvolatile memory device.

It is still another object of the present invention to provide a nonvolatile semiconductor memory in which a characteristic suitable for a multi-valued memory can be obtained, and a manufacturing method of the nonvolatile memory device.

In an aspect of the present invention, a nonvolatile memory device includes source and drain regions formed in a semiconductor substrate, and an insulating film formed on a channel region between the source region and the drain region in the semiconductor substrate. The nonvolatile memory device also includes a dielectric film formed above the channel region to store electric charge, and a control gate formed on the dielectric film. Compressive stress in the channel region is equal to or less than 50 MPa.

Here, tensile stress in the channel region is preferably equal to or less than 50 MPa.

Also, the control gate may have a laminate structure in which a conductive semiconductor film and a metal film are laminated in this order from a side of the dielectric film. In this case, the metal film may contain at least a material selected from the group consisting of tungsten, tantalum, molybdenum, tungsten nitride, tantalum nitride and molybdenum nitride.

Also, at least a part of the semiconductor substrate may have a laminate structure in which a silicon region and a silicon germanium region are laminated in this order from a side of a surface of the semiconductor substrate.

Also, at least one of the source region and the drain region contains one of a carbon added silicon region and a carbon added silicon germanium region.

Also, the dielectric film may include a semiconductor thin film.

Also, the dielectric film may include a charge storage insulating film containing electric charge trap centers. In this case, the charge storage insulating film may be formed of a material selected from the group consisting of silicon nitride, aluminum oxide, aluminum oxynitride, hafnium oxide, hafnium oxynitride, silicon hafnium oxide, silicon hafnium oxynitride, zirconium oxide, zirconium oxynitride, silicon zirconium oxide and silicon zirconium oxynitride.

Also, the dielectric film may include a charge storage insulating film in which semiconductor particles are dispersed.

Also, the dielectric film may include a ferroelectric film.

Also, the dielectric film may have a laminate structure in which a metal film and a ferroelectric film are laminated in this order from a side of the insulating film.

Also, the nonvolatile memory device may further include a first interlayer insulating film formed to cover the insulating film and the control gate. In this case, the first interlayer insulating film may have tensile stress. Also, the first interlayer insulating film may be formed from at least a film selected the group consisting of a SiN film, a SiON film, a SiCN film, an AlO film and an AlSiN film.

Also, the nonvolatile memory device may further include sidewall insulating films formed to cover side surfaces of the dielectric film and the control gate and to contact the insulating film at a bottom portion of the sidewall insulating films. The sidewall insulating film may include a first insulating film formed parallel to the insulating film, and a second insulating film parallel to the side surfaces. The first insulating film preferably has tensile stress. In this case, the first insulating film preferably contains at least one of a SiN film, a SiON film, a SiCN film, an AlO film and an AlSiN film.

Also, the nonvolatile memory device may further include device isolation sections formed in the semiconductor substrate. In this case, the device isolation section may include a trench groove which contains a silicon nitride film.

In another aspect of the present invention, a method of manufacturing a nonvolatile memory device, is achieved by forming an insulating film on a semiconductor substrate; by forming an upper structure on the insulating film above a channel region of the semiconductor substrate; and by forming a source region and a drain region in the semiconductor substrate such that each of the source region and the drain region contacts the channel region, and the source region and the drain region are apart from each other. The upper structure may include a dielectric film to store electric charge and a control gate which are laminated in this order. The forming an upper structure is achieved by forming a conductive semiconductor film and a metal film in this order from a side of the dielectric film, as the control gate such that compressive stress is equal to or less than 50 MPa or tensile stress is equal to or less than 50 Mpa in the channel region, after the nonvolatile memory device is formed.

Here, the metal film may include a film formed of at least a material selected from the group consisting of tungsten, tantalum, molybdenum, tungsten nitride, tantalum nitride and molybdenum nitride.

In another aspect of the present invention, a method of manufacturing a nonvolatile memory device, is achieved by forming a laminate structure of a silicon germanium film and a silicon film, which are laminated in this order, on a semiconductor substrate; by forming an insulating film on the laminate structure; by forming an upper structure, in which an dielectric film and a control gate are laminated in this order, above a channel region of the semiconductor substrate to cover the insulating film; and by forming a source region and a drain region in the semiconductor substrate such that each of the source region and the drain region contacts the channel region, and the source region and the drain region are apart from each other. The laminate structure is formed such that compressive stress is equal to or less than 50 MPa or tensile stress is equal to or less than 50 Mpa in the channel region, after the nonvolatile memory device is formed.

In another aspect of the present invention, a method of manufacturing a nonvolatile memory device, is achieved by forming an insulating film on a semiconductor substrate; by forming an upper structure, in which a dielectric film and a control gate are laminated in this order, above a channel region of the semiconductor substrate to cover the insulating film; by forming one of a carbon added silicon germanium film and a carbon added silicon film in at least a part of a source region and a drain region to be formed in the semiconductor substrate; and by forming the source region and the drain region in the semiconductor substrate such that each of the source region and the drain region contacts the channel region, and the source region and the drain region are apart from each other. Each of the carbon added silicon germanium film and the carbon added silicon film is formed such that compressive stress is equal to or less than 50 MPa or tensile stress is equal to or less than 50 Mpa in the channel region, after the nonvolatile memory device is formed.

In another aspect of the present invention, a method of manufacturing a nonvolatile memory device, is achieved by forming device isolation sections in a semiconductor substrate; by forming an insulating film on a portion of the semiconductor substrate other than the device isolation sections; by forming an upper structure, in which an electric charge storage film, a second insulating film and a control gate are laminated in this order, to cover the insulating film above a channel region of the semiconductor substrate; and by forming a source region and a drain region in the semiconductor substrate such that each of the source region and the drain region contacts the channel region and the source region and the drain region are apart from each other. The forming device isolation sections is achieved by forming the device isolation sections of a trench structure containing a silicon nitride film such that compressive stress is equal to or less than 50 MPa or tensile stress is equal to or less than 50 Mpa in the channel region, after the nonvolatile memory device is formed.

In another aspect of the present invention, a method of manufacturing a nonvolatile memory device, is achieved by forming an insulating film on a semiconductor substrate; by forming an upper structure, in which a dielectric film and a control gate are laminated in this order, above a channel region of the semiconductor substrate to cover the insulating film; by forming a source region and a drain region in the semiconductor substrate such that each of the source region and the drain region contacts the channel region, and the source region and the drain region are apart from each other, and by forming a first insulating film to cover the insulating film and the upper structure such that compressive stress is equal to or less than 50 MPa or tensile stress is equal to or less than 50 Mpa in the channel region, after the nonvolatile memory device is formed.

Here, the forming a first insulating film may be achieved by forming the first insulating film at a temperature equal to or higher than 600° C. by a CVD method by using silane and dichlorosilane as source gases.

Here, the forming a first insulating film may be achieved by forming the first insulating film at a temperature equal to or higher than 600° C. by a CVD method by using monomethylsilane and hydrazine as source gases.

Also, the method may be achieved by further including forming a second insulating film to cover the insulating film and the upper structure; and removing a portion of the second insulating film other than side surfaces of the upper structure; and forming sidewall insulating films on the side surfaces. The sidewall insulating films have tensile stress. In this case, at least one of the first insulating film and the sidewall insulating film is preferably formed from at least a film selected from the group consisting of a SiN film, a SiON film, a SiCN film, an AlO film and an AlSiN film.

Also, the forming an upper structure may be achieved by forming a semiconductor film as an electric charge storage film.

Also, the forming an upper structure may be achieved by forming an electric charge storage insulating film which contains electric charge trap centers, as the dielectric film. In this case, the forming an electric charge storage insulating film may be achieved by forming the electric charge storage insulating film of at least one material selected from the group consisting of silicon nitride, aluminum oxide, aluminum oxynitride, hafnium oxide, hafnium oxynitride, silicon hafnium oxide, silicon hafnium oxynitride, zirconium oxide, zirconium nitride, silicon zirconium oxide, and silicon zirconium nitride.

Also, the forming an upper structure may be achieved by forming an electric charge storage insulating film with semiconductor particles dispersed therein as the dielectric film.

Also, the forming an upper structure may be achieved by forming a ferroelectric film as the dielectric film.

Also, the forming an upper structure may be achieved by forming a metal film and a ferroelectric film in this order from a side of the insulating film, as the dielectric film.

Also, the method may be achieved by further including forming device isolation sections in a self-alignment with the upper structure.

DESCRIPTION OF THE PREFERRED EMBODIMENTS

Hereinafter, a nonvolatile memory device and a manufacturing method of the nonvolatile memory device will be described in detail with reference to the attached drawings.

[First Embodiment]

First, the nonvolatile memory device according to the first embodiment of the present invention will be described below.

Figure 1A:
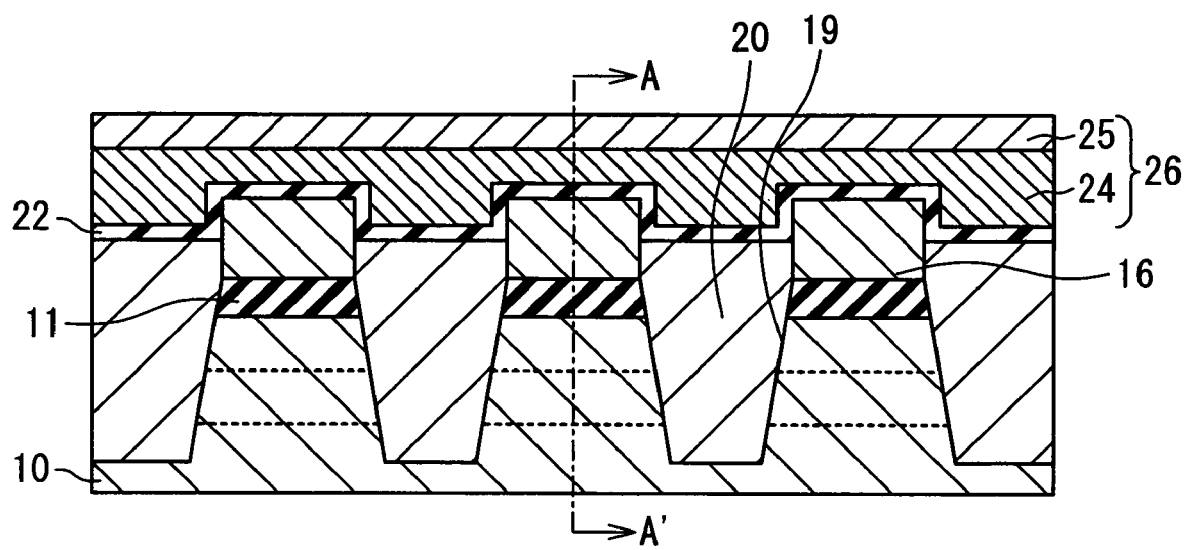
FIG. 1A is a cross sectional view showing a structure of a nonvolatile memory device according to a first embodiment of the present invention.
Figure 1B:
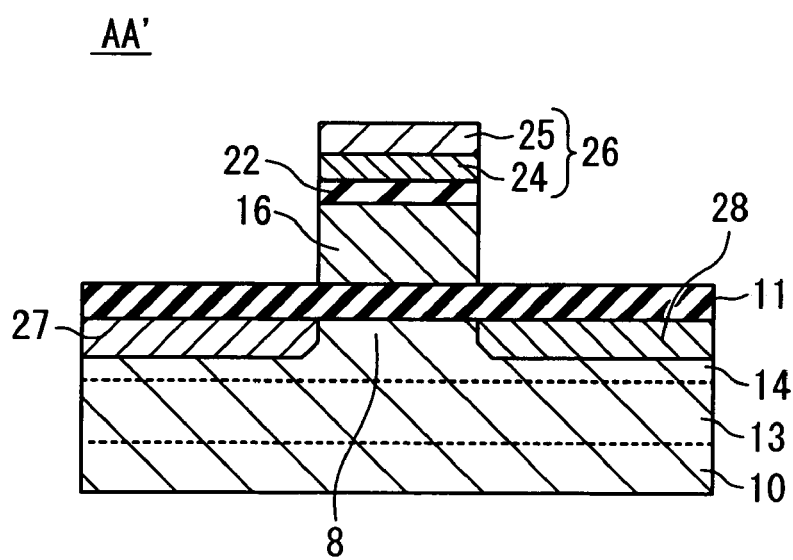
FIG. 1B is a cross sectional view of the nonvolatile memory device taken along the line A–A' in FIG. 1A.

FIG. 1A is a cross sectional view showing the structure of the nonvolatile memory device according to the first embodiment of the present invention. FIG. 1B is a cross sectional view of the nonvolatile memory device taken along the line A–A' in FIG. 1A. The nonvolatile memory device has a semiconductor substrate 10, a gate insulating film 11, a floating gate 16, an interlayer insulating film 22, a control gate 26, and a device separation insulating section 20. Here, a case will be described that the conductivity type of the semiconductor substrate 10 is a P-type. However, the same is applicable to the N-type semiconductor substrate.

Referring to FIG. 1B, the semiconductor substrate 10 has a deep N-type well (N-well) 13 doped with an N-type impurity and a P-type well (P-well) 14 doped with a P-type impurity in the surface side of the semiconductor substrate 10. An N-type source 27 and drain 28 are provided in the P-well 14 to contact the surface of the semiconductor substrate 10. A region between the source 27 and the drain 28 in a lateral direction is a channel region 8 of the nonvolatile memory device. The distance between them is, for example, 150 nm.

The gate insulating film 11 as a first insulating film is formed of silicon oxide to cover the channel region 8, and at least a part of each of the source 27, and the drain 28. The film thickness of the gate insulating film 11 is 10 nm such that electric charge can tunnel.

The floating gate 16 serving as an electric-charge storage film is formed of polysilicon to cover the gate insulating film 11 above the channel region 8. The film thickness of the floating gate 16 is 250 nm. The floating gate 16 has a plane size of 150 nm*150 nm.

The interlayer insulating film 22 serving as a second insulating film is formed to cover the floating gate 16. The interlayer insulating film 22 is formed of silicon oxynitride (SiON) or from a laminated film of silicon oxide, silicon nitride, and silicon oxide, and has the film thickness of 30 nm.

The control gate 26 is formed to cover the polysilicon interlayer insulating film 22. The control gate 26 has a polysilicon film 24 and a metal film 25. The polysilicon film 24 is formed to cover the polysilicon interlayer insulating film 22, and has the film thickness of 100 nm. The metal film 25 is formed to cover the polysilicon film 24, and has the film thickness of 150 nm. The metal film 25 applies a tensile stress to the channel region 8 to relax the compressive stress of the channel region 8. The metal film 25 is formed of tungsten, tantalum, molybdenum, or nitride of any one of them. It may be also formed of a combination of them or a laminated film.

It is possible to adjust tensile stress of the metal film 25 to a desired value by adjusting the film thickness or the material of the film. By adjusting the composition of tungsten and the like or nitride of any one of them, it is possible to obtain a desired tensile stress. For example, a ratio of tungsten or the like and other conductive substance is equal to 90:10. Thereby, it is possible to relax the compressive stress of the channel region 8 in accordance with the compressive stress.

Referring to FIG. 1A, device separation grooves 19 for separating adjacent devices from each other are formed on the semiconductor substrate 10 and the element separation insulating sections 20 of silicon oxide fill them. The device separation insulating section 20 is STI (Shallow Trench Isolation). The depth of the device separation insulating section 20 is deeper than that of the N well 13.

Figure 34:
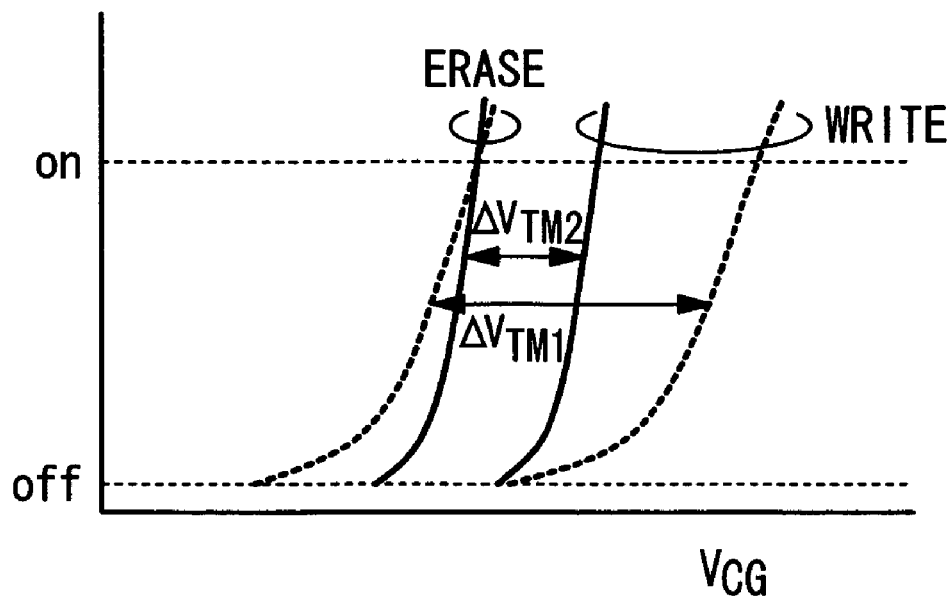
FIG. 34 is a graph showing a relation between voltage and current of a memory cell.

The characteristic of the nonvolatile memory device having the above structure will be described below. FIG. 34 is a graph showing a relation between a voltage and current of a memory cell. The vertical axis denotes drain current I, in which an ON level corresponds to on-current and an OFF level corresponds to off-current. The horizontal axis denotes a voltage $V_{CG}$ applied to the control gate. The graph of a broken line shows a case in which the stress of the channel region 8 is high. The graph of a solid line shows a case in which the stress of the channel region 8 is low. The expression "erasure" denotes a case in which data is erased. The expression "write" shows a case in which data is written.

In FIG. 34, the change $\Delta V_{TM2}$ of the threshold value of the voltage $V_{CG}$ when the stress of the channel region 8 is small (solid line) is small compared to the change $\Delta V_{TM1}$ of the threshold value of the voltage $V_{CG}$ when the stress is large (broken line). Electric charge $\Delta Q$ moving from the channel region 8 to the floating gate 16 due to rewriting of data is shown by the following equation.

$$\Delta Q = C_{FG} * \Delta V_{TM}$$

where $C_{FG}$ is a capacity formed of the floating gate 16, the gate insulating film 11, and the channel region 8. That is, as a stress decreases, the change $\Delta V_{TM}$ of a threshold value decreases, for example, from $\Delta V_{TM1}$ to $\Delta V_{TM2}$. In this case, seen from the above equation, a quantity of electric charge to be taken out from or injected into through the gate insulating film 11 becomes small each time data is rewritten. Thus, deterioration of the gate oxide film is restrained and deterioration of on-current and deterioration of a holding characteristic are restrained.

Figure 35:
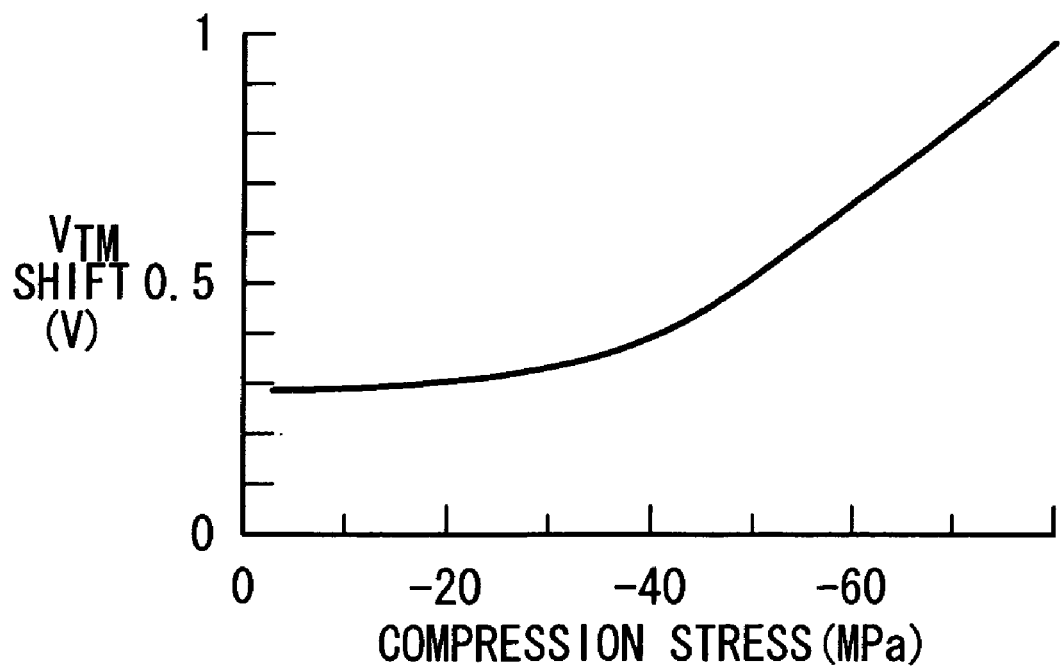
FIG. 35 is a graph showing a relation between compressive stress of a channel region 8 and change of threshold value of gate voltages.

FIG. 35 is a graph showing a relation between compressive stress of the channel region 8 and a change of the threshold value of a gate voltage. The vertical axis is $V_{TM}$ shift (V) ($\Delta V_{TM}$ in the above case) as the change of the threshold value of the gate voltage and the horizontal axis is the compressive stress (MPa) of the channel region 8. In this case, a sign of minus indicates compressive stress. As seen from FIG. 35, the $V_{TM}$ shift ($\Delta V_{TM}$) is decreased as the compressive stress of the channel region 8 decreases. In order to obtain the effect of restraint of the above deterioration, it is preferable to decrease the $V_{TM}$ shift to 0.5 V or lower in the design of a memory cell. In this case, it could be understood that it is necessary to set the compressive stress of the channel region 8 to approx. 50 MPa or less. Moreover, it is more preferable to set the $V_{TM}$ shift to 0.3 V or lower. In this case, the compressive stress is decreased to approx. 20 MPa or less.

On the other hand, when the tensile stress of the channel region 8 is large, there is a problem that the combination of hydrogen atoms at an interface levels between a silicon oxide film and a silicon film becomes weak so that the interface levels are easily generated as described by J. T. Yount, et al. in J. APPL. Phys, Vol. 77, PP. 699–705 (1995). The generation and recovery of the interface levels at the interface between a tunnel film and a silicon film cause threshold change of the gate voltage in case of a flash memory. Therefore, when the tensile stress is large, the holding characteristic of the flash memory is deteriorated, too. Though the upper limit of the tensile stress of the channel region 8 is not always clear to a preferable holding characteristic, it is found that a preferable holding characteristic can be obtained at least to an element having +50 MPa or less, more preferably to an element having +20 MPa. Here, a sign of plus indicates a tensile stress. Therefore, it is preferable that the channel region 8 has a tensile stress of +50 MPa or less in order to obtain a preferable holding characteristic. It is more preferable that the tensile stress is +20 MPa or less.

From the above result, it is preferable that a stress P of the channel region 8 meets a relation of −50 MPa (compression) $\leq P \leq 50$ MPa (tensile). It is more preferable that the stress P meets a relation of −20 MPa (compression)$\leq P \leq +20$ MPa (tensile).

Figure 36:
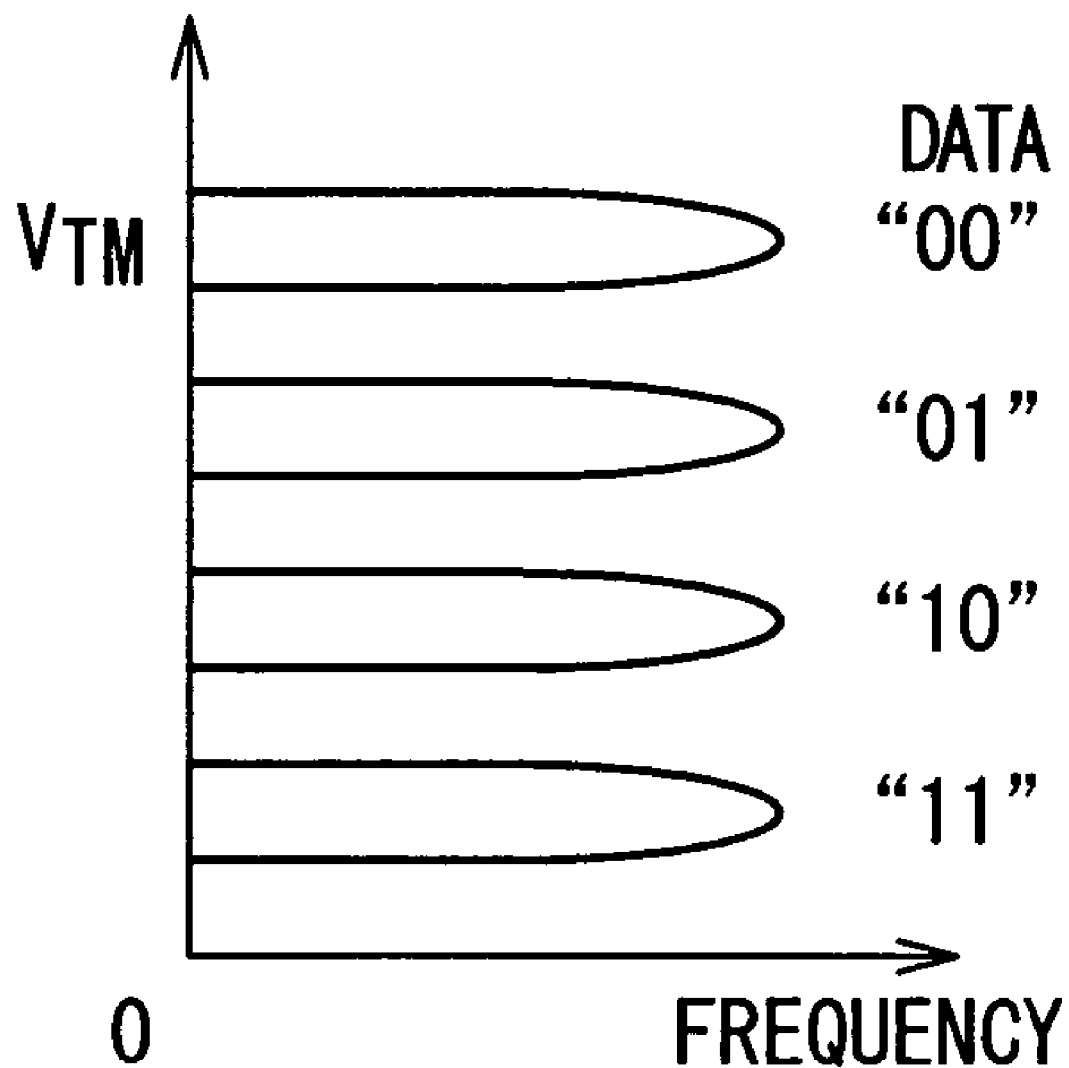
FIG. 36 is a graph showing a distribution of threshold values of gate voltages.

Also, the decrease of $\Delta V_{TM}$ as described above is effective to a memory cell for a multi-value. FIG. 36 is a graph showing a distribution of threshold values of the gate voltage. "Data" shown at the right side of the graph indicates the data to be stored, and a threshold voltage $V_{TM}$ corresponding to the data is indicated on the vertical axis. The horizontal axis indicates the frequency of the voltage $V_{TM}$. The threshold voltage $V_{TM}$ corresponding to each data is distributed in a narrower range as the $V_{TM}$ shift ($\Delta V_{TM}$) of the voltage $V_{TM}$ is smaller. FIG. 36 shows that four types of data can be all stored as an example. However, if the $V_{TM}$ shift is further decreased, it is possible to store more types of data.

Next, the manufacturing method of a nonvolatile memory device in the first embodiment of the present invention will be described below. FIGS. 2A and 2B to FIGS. 11A and 11B are cross sectional views for showing steps in the manufacturing method of a nonvolatile memory device of the present invention. However, the relation between FIGS. 2A to 11A and FIGS. 2B to 11B is the same as the relation between FIGS. 1A and 1B (a cross sectional view taken along the line A–A'). Also, FIGS. 1A and 1B are properly used for description.

Figure 2A:
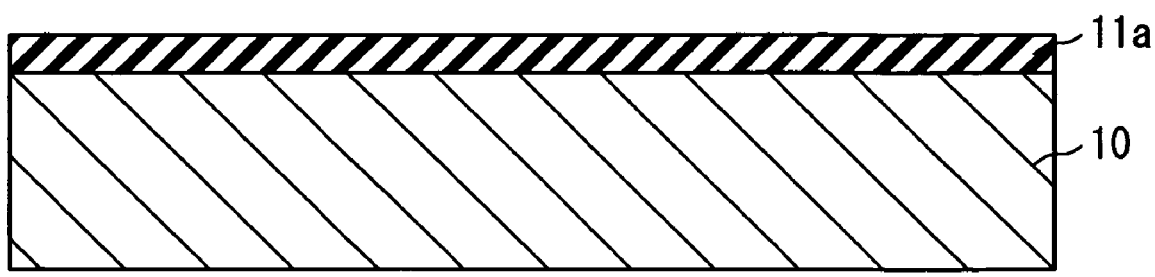
FIG. 2A is a cross sectional view of the nonvolatile memory device in a manufacturing method according to the first embodiment of the present invention.
Figure 2B:
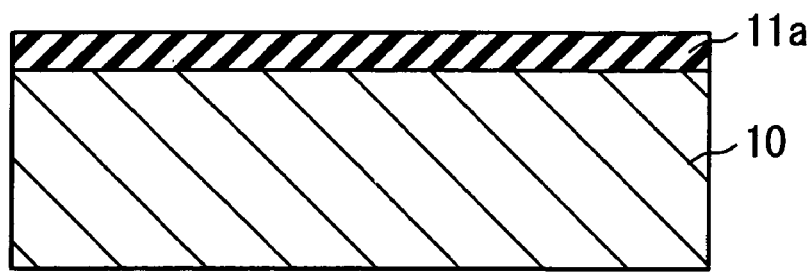
FIG. 2B is a cross sectional view of the nonvolatile memory device taken along the line A–A' in FIG. 2A.

First, as shown in FIGS. 2A and 2B, a gate insulating film 11a is formed to have the film thickness of 10 nm by a thermal oxidation method and to cover the semiconductor substrate 10 whose surface has been cleaned.

Figure 3A:
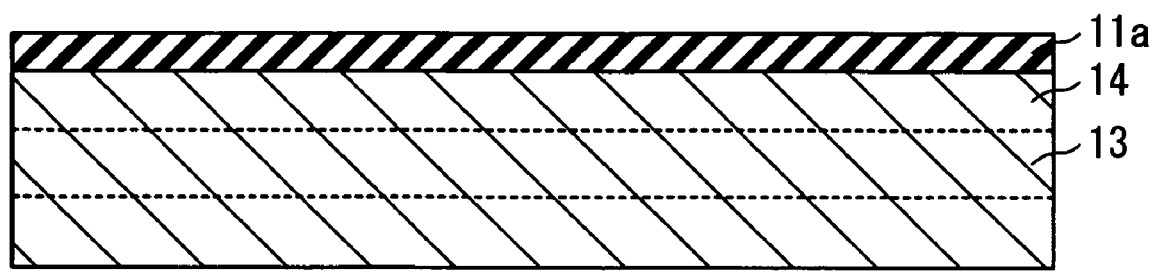
FIG. 3A is a cross sectional view of the nonvolatile memory device in a manufacturing method according to the first embodiment of the present invention.
Figure 3B:
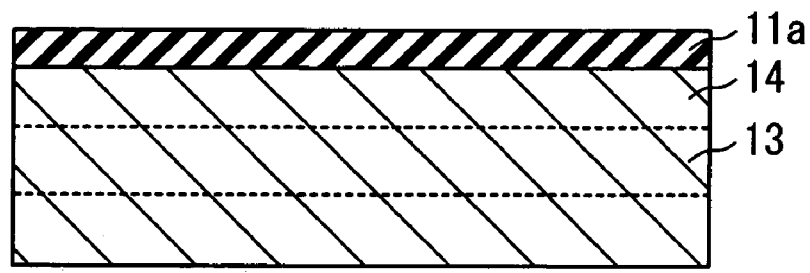
FIG. 3B is a cross sectional view of the nonvolatile memory device taken along the line A–A' in FIG. 3A.

Next, as shown in FIGS. 3A and 3B, the N-type impurity is ion-implanted into the semiconductor substrate 10 through the gate insulating film 11a. Subsequently, a deep N-well 13 is formed by heat treatment. Then, a P-type impurity is ion-implanted into the semiconductor substrate 10 through the gate insulating film 11a. Thus, the P-well 14 is formed through heat treatment.

Figure 4A:
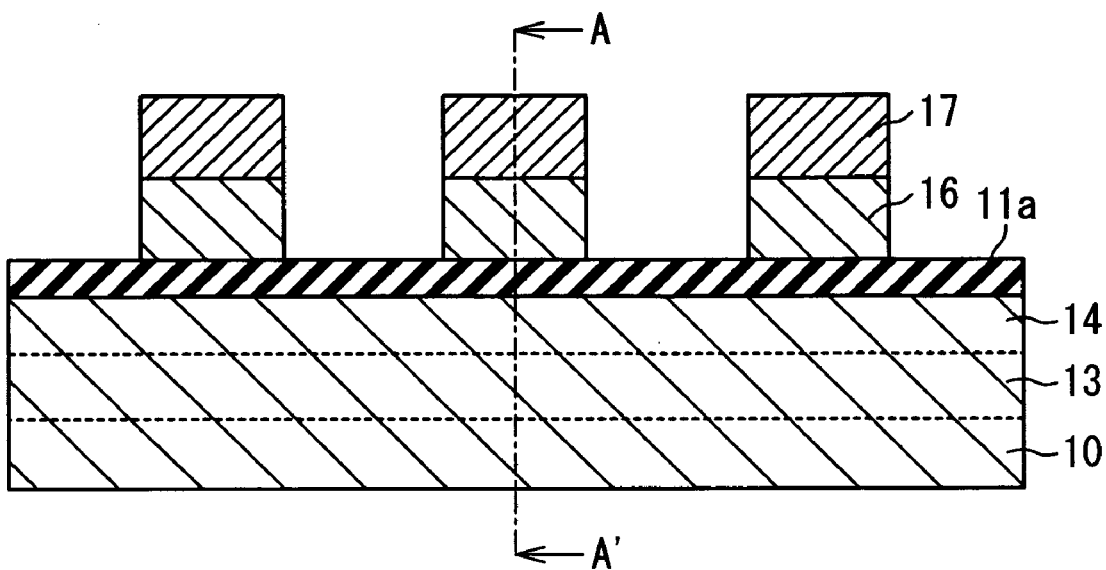
FIG. 4A is a cross sectional view of the nonvolatile memory device in a manufacturing method according to the first embodiment of the present invention.
Figure 4B:
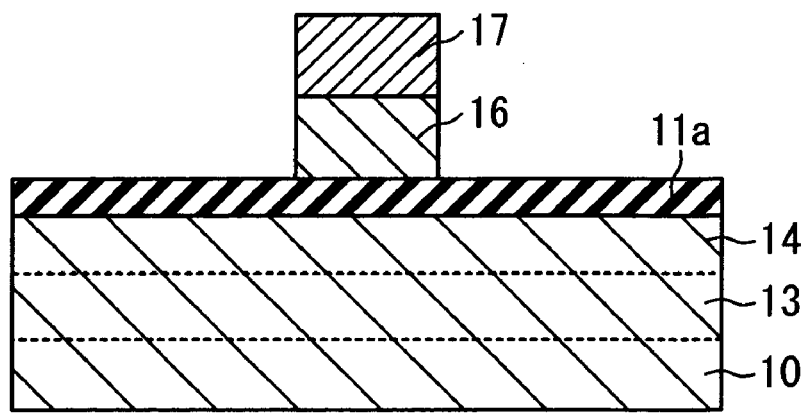
FIG. 4B is a cross sectional view of the nonvolatile memory device taken along the line A–A' in FIG. 4A.

Next, as shown in FIGS. 4A and 4B, a polysilicon film is formed to have the film thickness of 250 nm by a CVD (chemical vapor deposition) method and to cover the gate insulating film 11a. A silicon nitride film is formed on the polysilicon film to have the film thickness of 150 nm by the CVD method. Subsequently, the silicon nitride film and the polysilicon film are patterned into the shape of memory cell by the techniques of photolithography and etching. Thus, a silicon nitride film 17 and a floating gate 16 are formed.

Figure 5A:
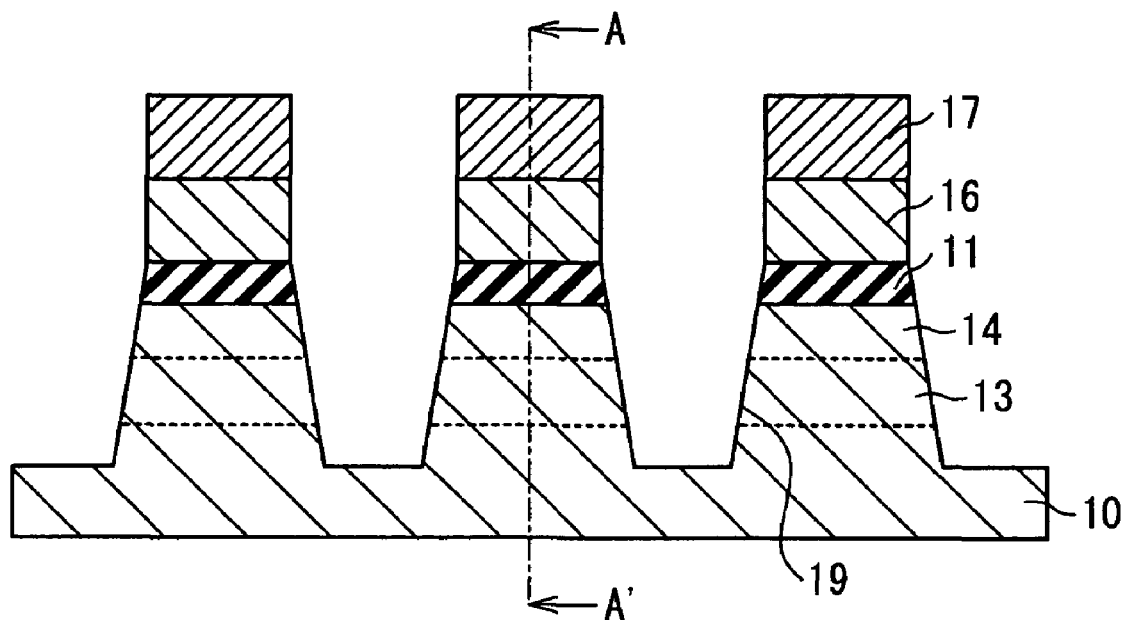
FIG. 5A is a cross sectional view of the nonvolatile memory device in a manufacturing method according to the first embodiment of the present invention.
Figure 5B:
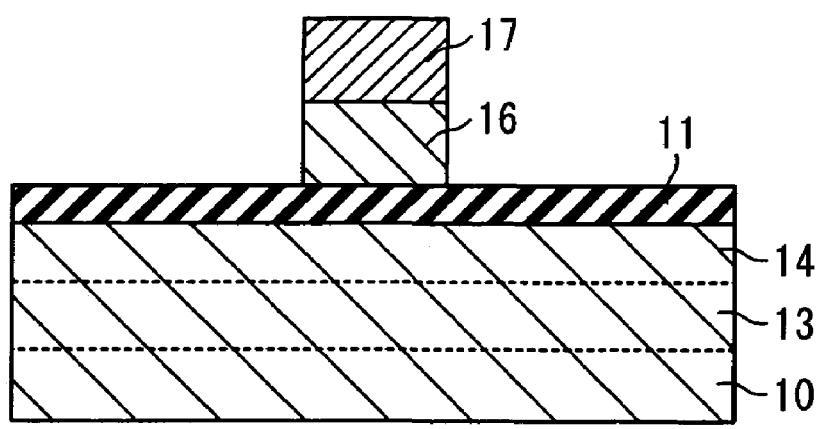
FIG. 5B is a cross sectional view of the nonvolatile memory device taken along the line A–A' in FIG. 5A.

Next, as shown in FIG. 5A, device separation grooves (trench) 19 are formed in self alignment with the silicon nitride film 17 and the floating gate 16 by the techniques of photolithography and etching. The depth of the groove 19 is deeper than that of the deep N-well 13. Through the above etching process, the gate insulating film 11a becomes the gate insulating film 11. In this case, as shown in FIG. 5B, the device separation groove 19 is not formed in the direction of FIG. 5B.

Figure 6A:
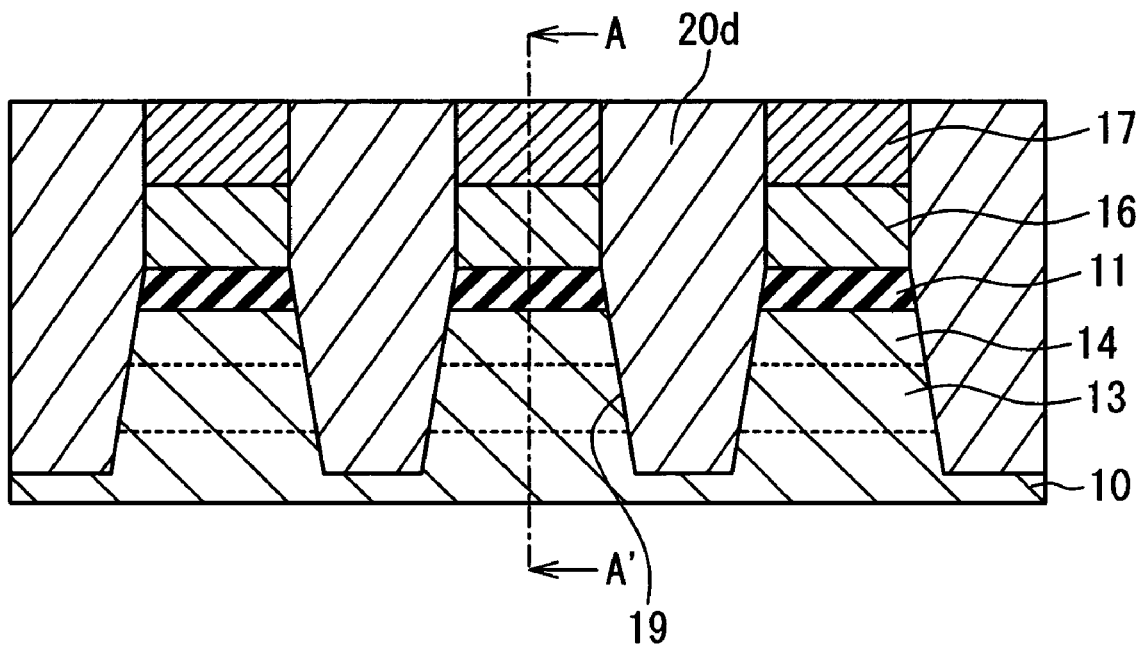
FIG. 6A is a cross sectional view of the nonvolatile memory device in a manufacturing method according to the first embodiment of the present invention.
Figure 6B:
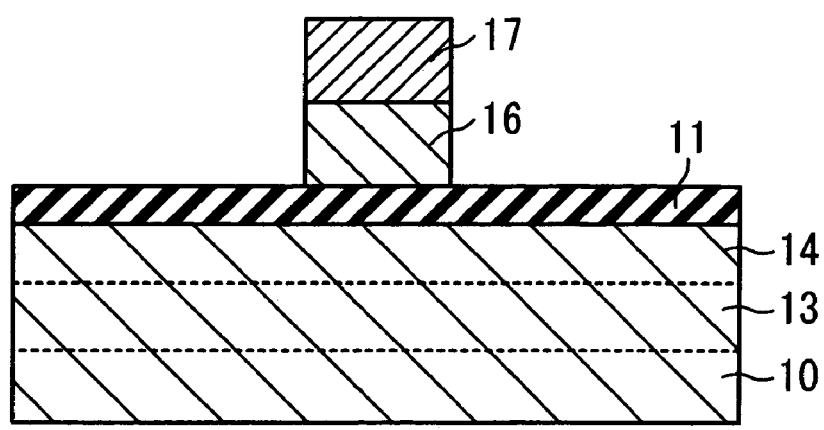
FIG. 6B is a cross sectional view of the nonvolatile memory device taken along the line A–A' in FIG. 6A.

Next, as shown in FIGS. 6A and 6B, a silicon oxide film 20d is formed by a high-density plasma CVD method to fill the device separation grooves 19 and to cover the peripheries and upper portions of the silicon nitride film 17 and the floating gate 16. Subsequently, the silicon oxide film 20d is subjected to a CMP (chemical mechanical polishing) method so that the surface of the silicon nitride 17 is exposed and the surface of the silicon oxide film 20d is flattened.

Figure 7A:
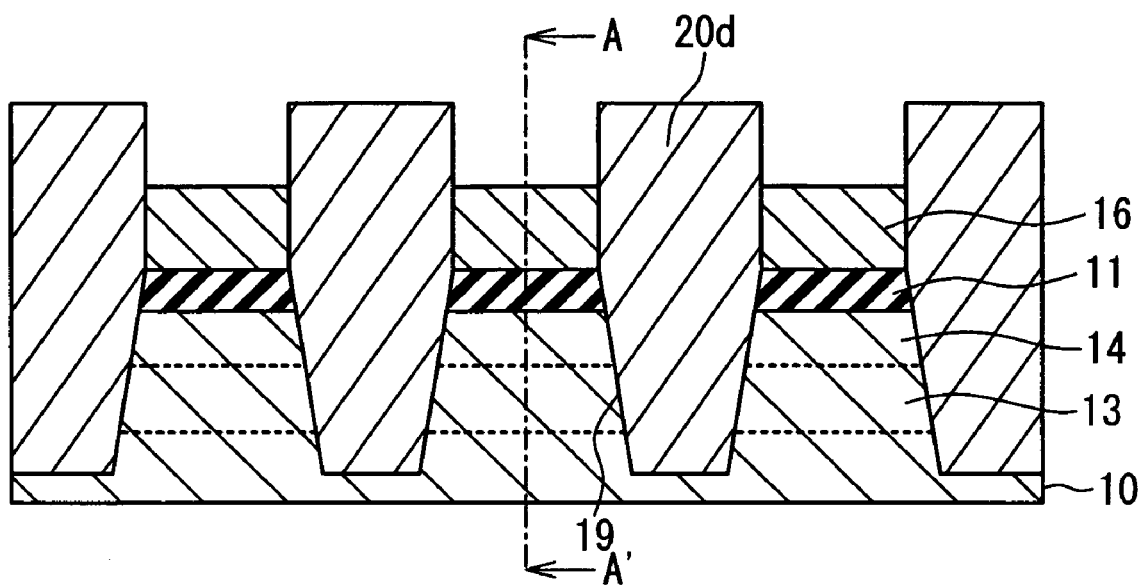
FIG. 7A is a cross sectional view of the nonvolatile memory device in a manufacturing method according to the first embodiment of the present invention.
Figure 7B:
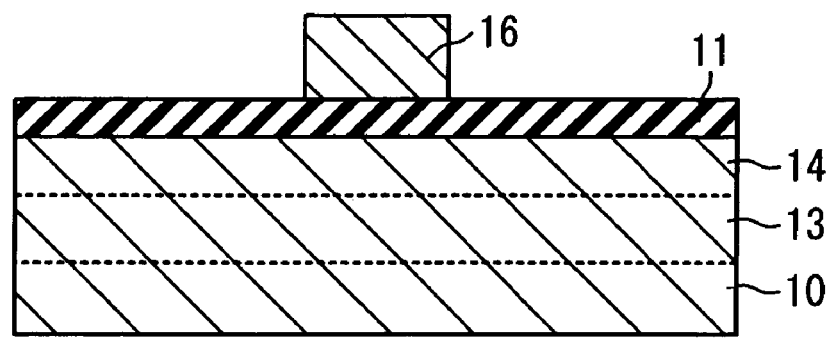
FIG. 7B is a cross sectional view of the nonvolatile memory device taken along the line A–A' in FIG. 7A.

Next, as shown in FIGS. 7A and 7B, the silicon nitride film 17 on the floating gate 16 is removed by the technique of wet etching.

Figure 8A:
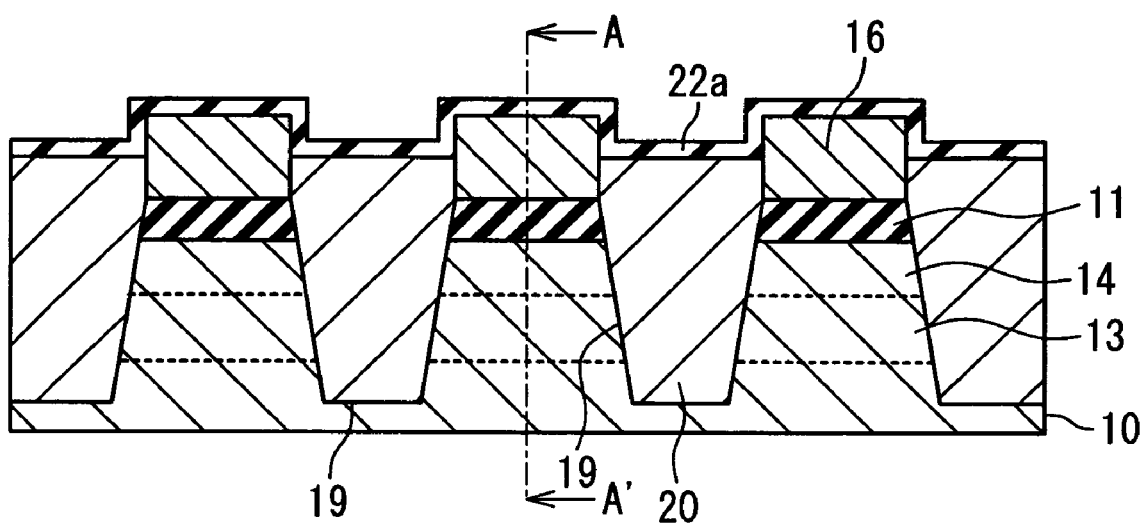
FIG. 8A is a cross sectional view of the nonvolatile memory device in a manufacturing method according to the first embodiment of the present invention.
Figure 8B:
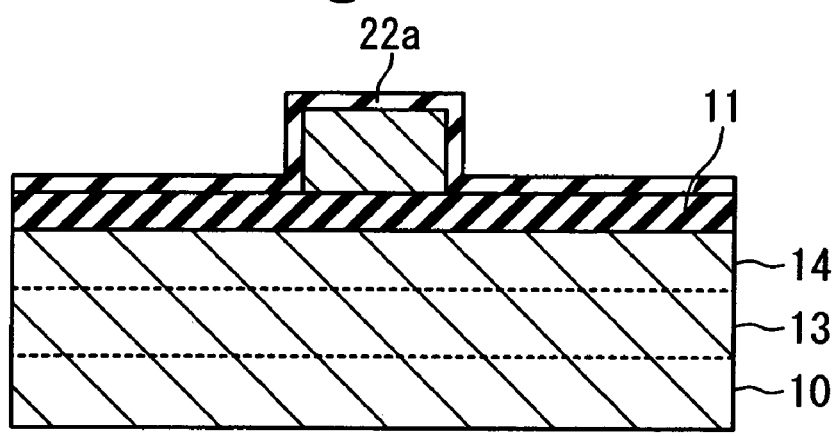
FIG. 8B is a cross sectional view of the nonvolatile memory device taken along the line A–A' in FIG. 8A.

Next, as shown in FIGS. 8A and 8B, the silicon oxide film 20d is made lower than the floating gate 16 by the technique of anisotropic etching. Thus, the device separation insulating section 20 is formed. Subsequently, a silicon oxynitride film 22a is formed by the CVD method to have the film thickness of 30 nm and to cover the device separation insulating section 20, the floating gate 16, and the gate insulating film 11.

Figure 9A:
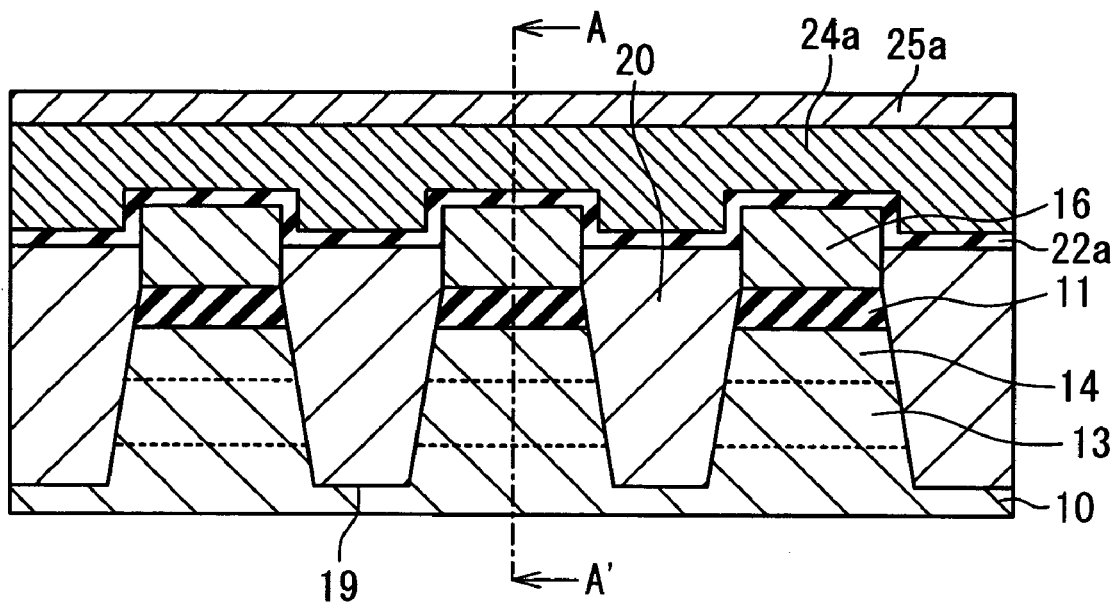
FIG. 9A is a cross sectional view of the nonvolatile memory device in a manufacturing method according to the first embodiment of the present invention.
Figure 9B:
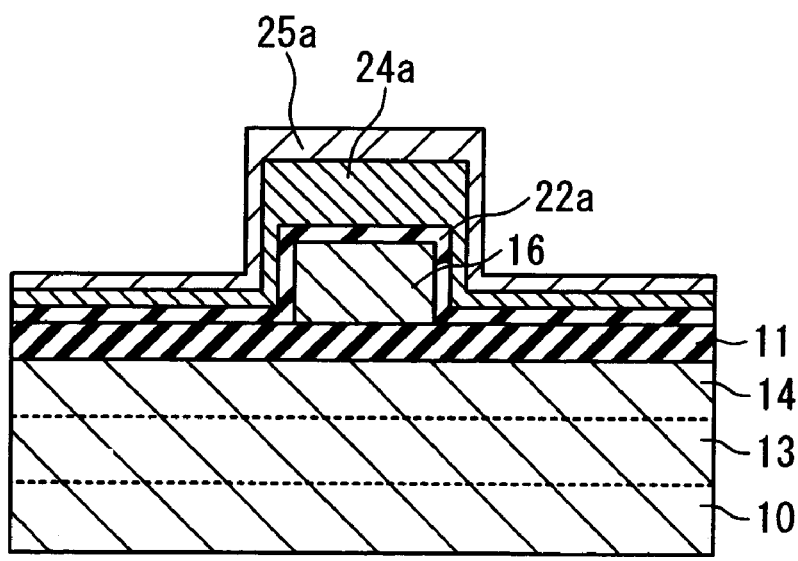
FIG. 9B is a cross sectional view of the nonvolatile memory device taken along the line A–A' in FIG. 9A.

Next, as shown in FIGS. 9A and 9B, a polysilicon film 24a is formed by the CVD method to have the film thickness of 100 nm and to cover the silicon oxynitride film 22a. Subsequently, a tungsten film 25a is formed by a magnetron sputtering method to cover the polysilicon film. The tungsten film 25a applies a tensile stress to the semiconductor substrate 10. It is possible to control the stress of the channel region by using the above tensile stress. The stress value is controlled to a desired value by changing a deposition rate, a substrate temperature at the time of sputtering, and a film thickness.

Figure 10A:
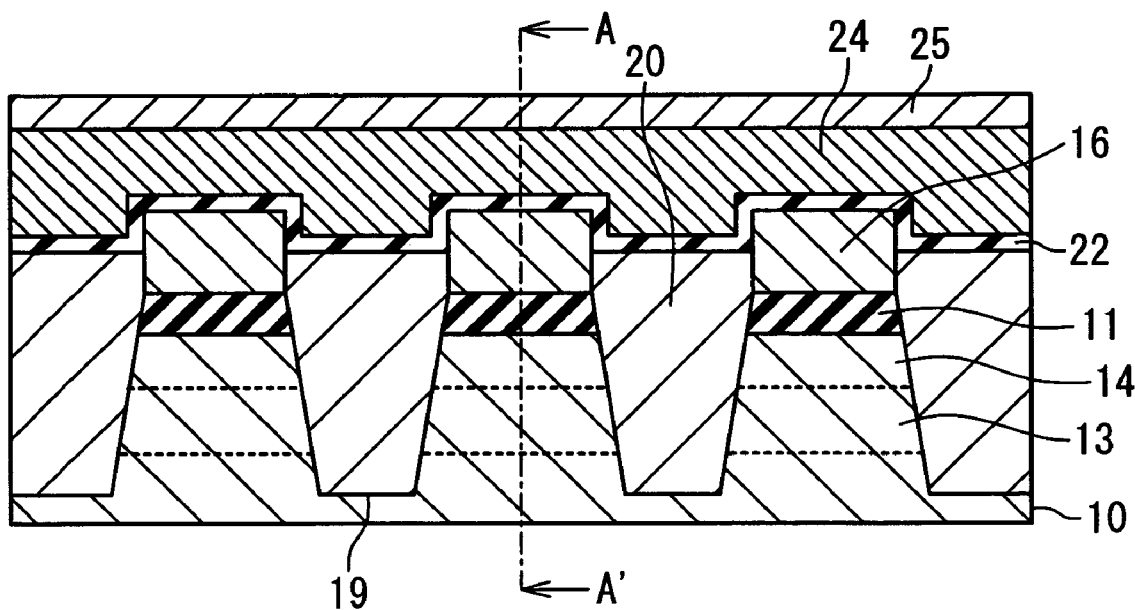
FIG. 10A is a cross sectional view of the nonvolatile memory device in a manufacturing method according to the first embodiment of the present invention.
Figure 10B:
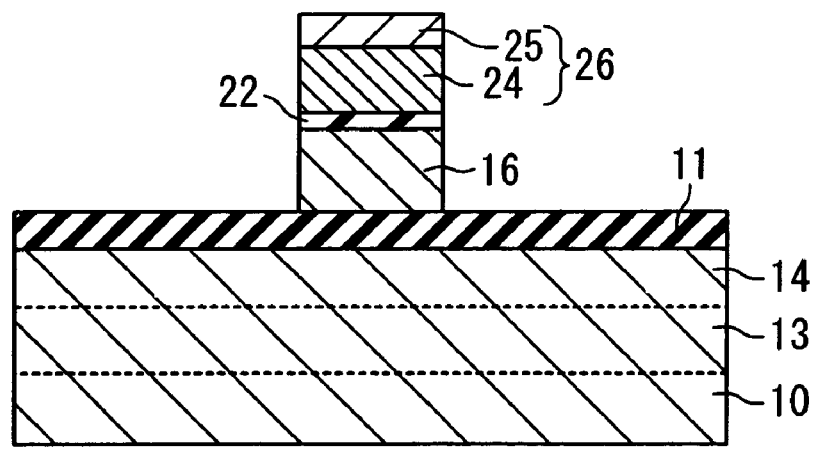
FIG. 10B is a cross sectional view of the nonvolatile memory device taken along the line A–A' in FIG. 10A.

Next, as shown in FIGS. 10A and 10B, the silicon oxynitride film 22a, the polysilicon film 24a, and the tungsten film 25a are patterned by the photolithography and etching to form the polysilicon interlayer insulating film 22, the polysilicon film 24, and the metal film 25.

Figure 11A:
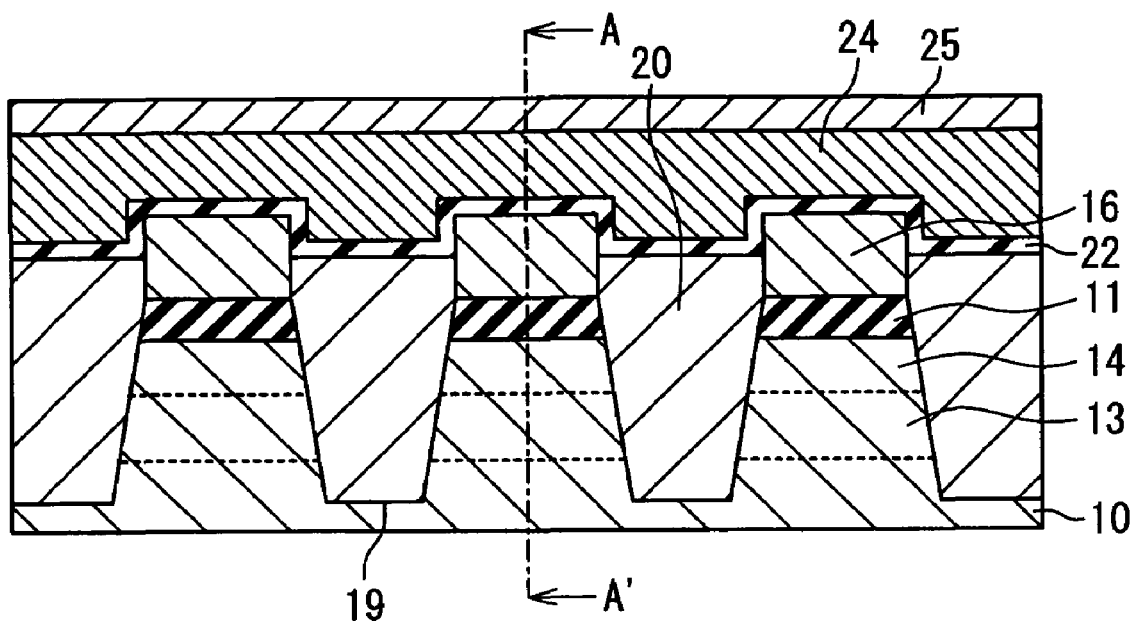
FIG. 11A is a cross sectional view of the nonvolatile memory device in a manufacturing method according to the first embodiment of the present invention.
Figure 11B:
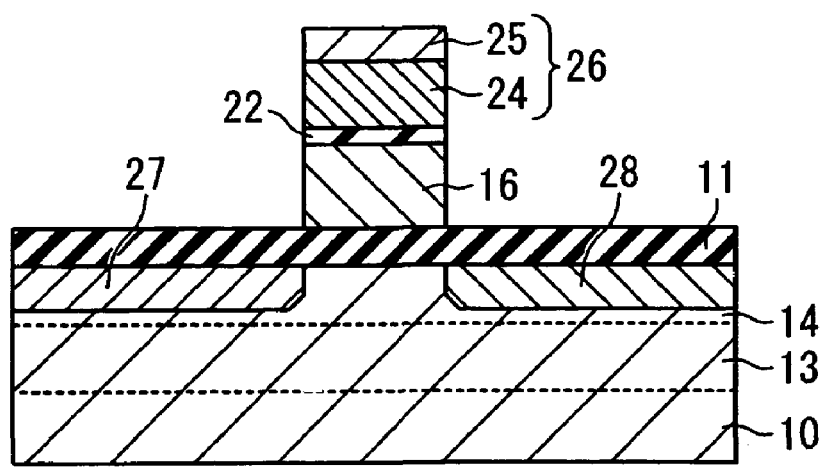
FIG. 11B is a cross sectional view of the nonvolatile memory device taken along the line A–A' in FIG. 11A.

As shown in FIGS. 11A and 11B, an N-type impurity is ion-implanted by using the polysilicon film 24 and the gate insulating film as a mask. Subsequently, the source 27 and the drain 28 are formed by heat treatment.

It is possible to manufacture the nonvolatile memory device having a small stress in the channel region 8 shown in FIGS. 1A and 1B by the above manufacturing method.

According to the present invention, it is possible to relax the stress of a channel region and to improve the mobility of electrons in the channel region. Therefore, an ON/OFF ratio of a memory cell is improved so that it is possible to the electric charge quantity to be taken out from or injected into the floating gate each time of data rewrite. Thus, it is possible to reduce deterioration of the gate insulating film (tunnel oxide film). In addition, by relaxing the stress at an interface between the gate insulating film (tunnel oxide film) and the channel region, increase of the interface levels generated by the rewriting operation can be restrained. Thus, it is possible to restrain the deterioration of on-current. Therefore, it is possible to restrain reduction of on-current and deterioration of the holding characteristic due to repetition of the rewriting operation of the writing operation or the erasing operation in a nonvolatile memory device.

[Second Embodiment]

The nonvolatile memory device according to the second embodiment of the present invention will be described below with reference to the attached drawings.

Figure 12A:
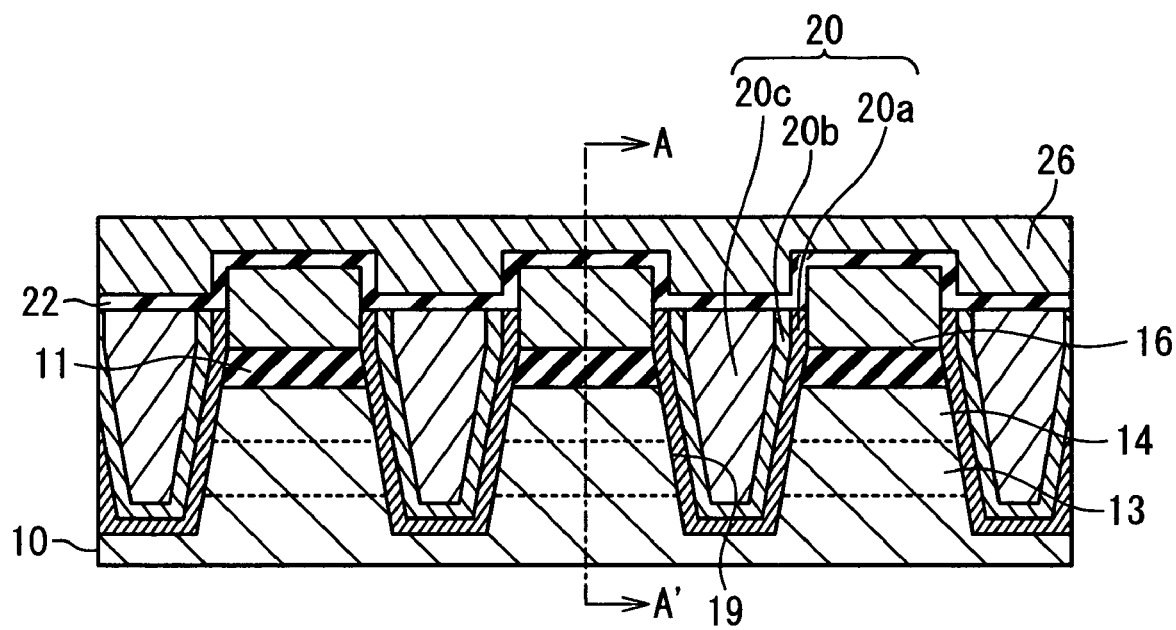
FIG. 12A is a cross sectional view showing the structure of the nonvolatile memory device according to a second embodiment of the present invention.
Figure 12B:
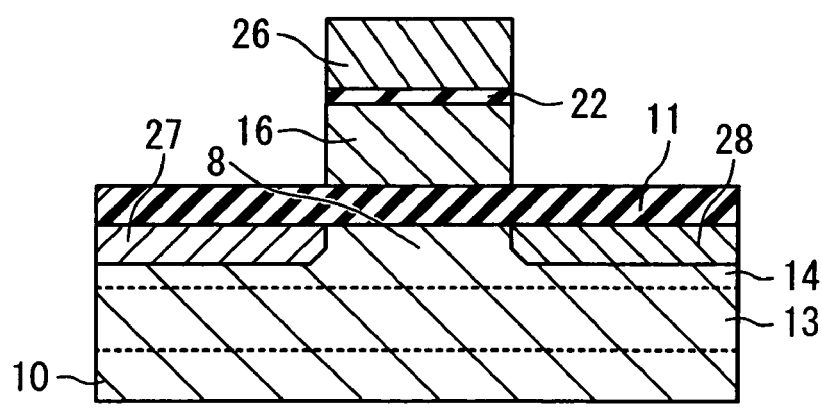
FIG. 12B is a cross sectional view of the nonvolatile memory device taken along the line A–A' in FIG. 12A.

FIG. 12A is a cross sectional view showing the structure of the nonvolatile memory device according to the second embodiment of the present invention. FIG. 12B is a cross sectional view of the nonvolatile memory device taken along the line A–A' in FIG. 12A. The nonvolatile memory device in the second embodiment has the semiconductor substrate 10, the gate insulating film 11, the floating gate 16, the polysilicon interlayer insulating film 22, the control gate 26, and the device separation insulating section 20. Here, a case will be described in which the conductivity type of the semiconductor substrate 10 is the P-type. However, the same is also applicable to the N-type.

In FIG. 12B, the semiconductor substrate 10 has a deep N-well 13 doped with the N-type impurity and the P-well 14 doped with a P-type impurity on the surface side of the semiconductor substrate 10. The N-type source 27 and drain 28 are formed in the P-well 14 to contact with the surface of the semiconductor substrate 10. The region between the source 27 and the drain 28 in the lateral direction is the channel region 8 of the nonvolatile memory device. The distance between them is 150 nm.

The gate insulating film 11 serving as a first insulating film is formed of silicon oxide to cover at least a part of each of the channel region 8, the source 27, and the drain 28. The film thickness is 10 nm such that electric charge can tunnel.

The floating gate 16 serving as an electric-charge storage film is formed of polysilicon to cover the gate insulating film 11 above the channel region 8. The film thickness is 250 nm. The floating gate 16 has the plane size of 150×150 nm.

The polysilicon interlayer insulating film 22 serving as a second electric-charge storage film is formed to cover the floating gate 16. The polysilicon interlayer insulating film 22 is formed of silicon oxynitride or from a laminated film of silicon oxide, silicon nitride, and silicon oxide. The film thickness is 30 nm.

The control gate 26 is formed of polysilicon to cover the polysilicon interlayer insulating film 22. The film thickness is 200 nm.

In FIG. 12A, the device separation groove 19 is formed on the semiconductor substrate 10 for separating adjacent device from each other and the device separation groove 19 is filled with the device separation insulating section 20. The device separation insulating section 20 has a STI (Shallow Trench Isolation) structure of a filmed structure which is formed from a silicon oxide film 20a, a silicon nitride film 20b, and a silicon oxide film 20c in order from the wall of the device separation groove 19. The depth of the device separation insulating section 20 is deeper than that of the deep N-well 13. The thicknesses of the silicon oxide film 20a and the silicon nitride 20b are 10 nm and 3 nm, respectively. It is possible to control the stress of the channel region by the STI structure having the filmed structure.

The STI structure having the filmed structure is possible to decrease the stress to be applied to the channel region 8 by adjusting a combination of thicknesses of the films of the STI structure, film forming conditions, and the depth of the device separation groove 19. Also, by adjusting composition of the device separation insulating section 20, it is possible to decrease the stress to be applied to the channel region 8.

The characteristics shown in FIGS. 34 to 36, are the same as those of the first embodiment, and the description of them is omitted.

Next, the nonvolatile memory device manufacturing method according to the second embodiment of the present invention will be described below. FIGS. 2A and 2B to FIGS. 5A and 5B, FIGS. 19A and 19B to FIGS. 21A and 21B, and FIGS. 9A and 9B to FIGS. 11A and 11B are cross sectional views for showing steps of the nonvolatile memory device manufacturing method in the second embodiment of the present invention. The relation between FIG. 12A and FIG. 2B is the same as the relation of a cross section and a cross section along the line A–A'. Also, FIGS. 12A and 12B are properly used for description.

First, the device separation grooves 19 shown in FIGS. 2A and 2B to FIGS. 5A and 5B are formed in the same manner as in the non-volatile memory manufacturing method in the first embodiment.

Figure 13A:
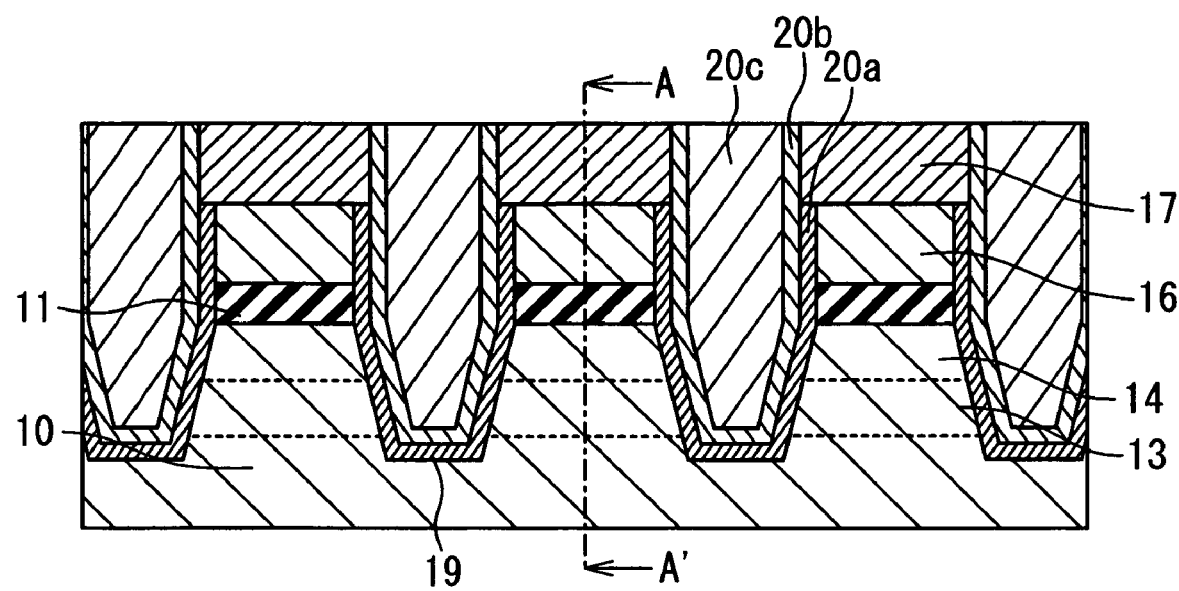
FIG. 13A is a cross sectional view of the nonvolatile memory device in the manufacturing method according to the second embodiment of the present invention.
Figure 13B:
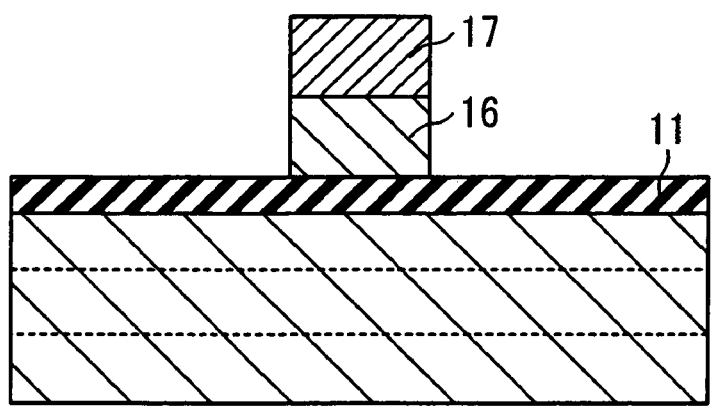
FIG. 13B is a cross sectional view of the nonvolatile memory device taken along the line A–A' in FIG. 13A.

Next, as shown in FIGS. 13A and 13B, the inner walls of the device separation grooves 19 and the outer walls of the floating gate 16 are oxidized by a thermal oxidation method to form the silicon oxide film 20a to have the thickness 10 nm. Subsequently, the silicon nitride film 20b is formed by a plasma CVD method to have the thickness 3 nm. Also, a silicon oxide film 20c is formed by a high-density plasma CVD method to embed the remaining device separation groove 19. Subsequently, the silicon nitride film 20b and the silicon oxide film 20c are polished by a CMP method until the surface of the silicon nitride film 17 is exposed. The STI structure having this filmed structure has a small compressive stress to be applied to the channel region, compared with a case of the normal STI structure. Therefore, it is possible to obtain a preferable holding characteristic. Also, it is possible to control the stress to be applied to the channel region in accordance with the thickness of the silicon nitride film 20b or the oxidation condition of the silicon oxide film 20a.

Figure 14A:
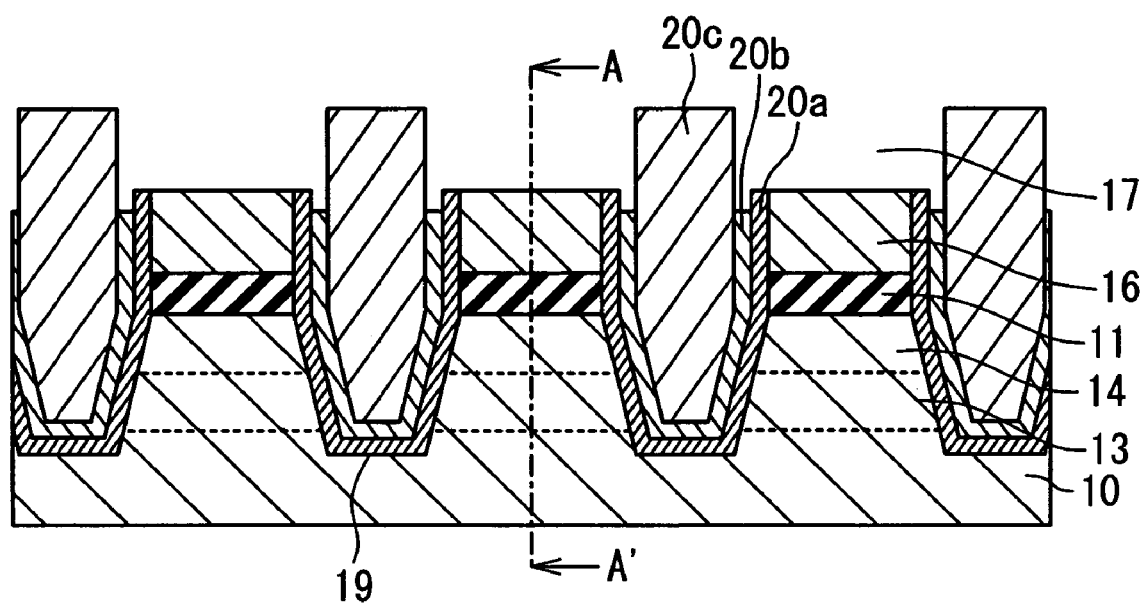
FIG. 14A is a cross sectional view of the nonvolatile memory device in the manufacturing method according to the second embodiment of the present invention.
Figure 14B:
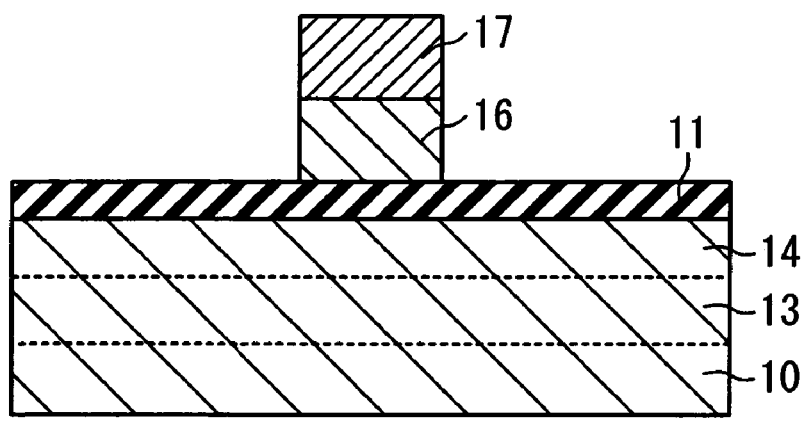
FIG. 14B is a cross sectional view of the nonvolatile memory device taken along the line A–A' in FIG. 14A.

Next, as shown in FIGS. 14A and 14B, a part of the silicon nitride film 17 on the floating gate 16 and a part of the silicon nitride film 20b are removed by a wet etching.

Figure 15A:
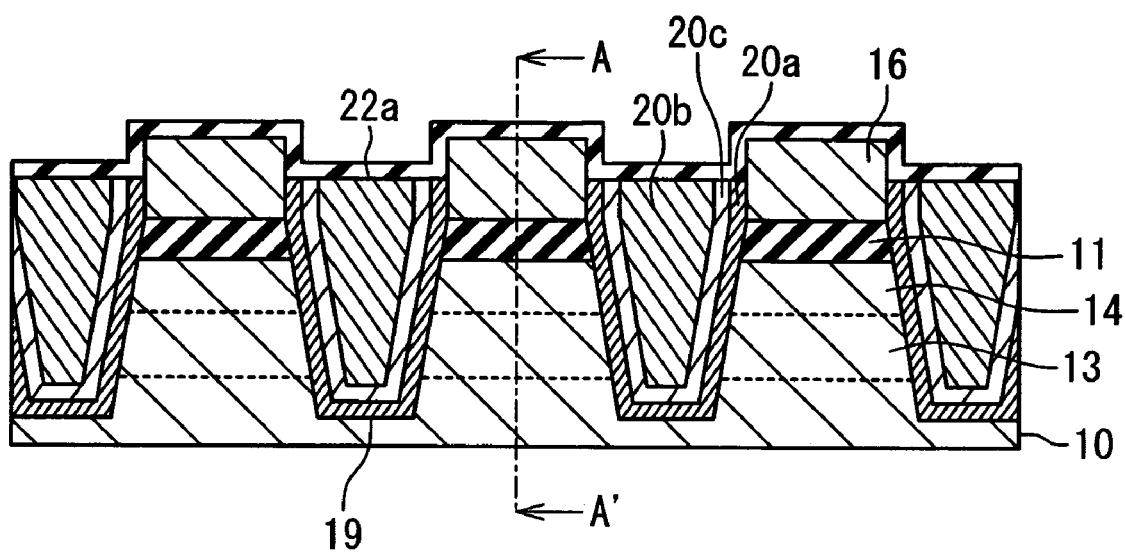
FIG. 15A is a cross sectional view of the nonvolatile memory device in the manufacturing method according to the second embodiment of the present invention.
Figure 15B:
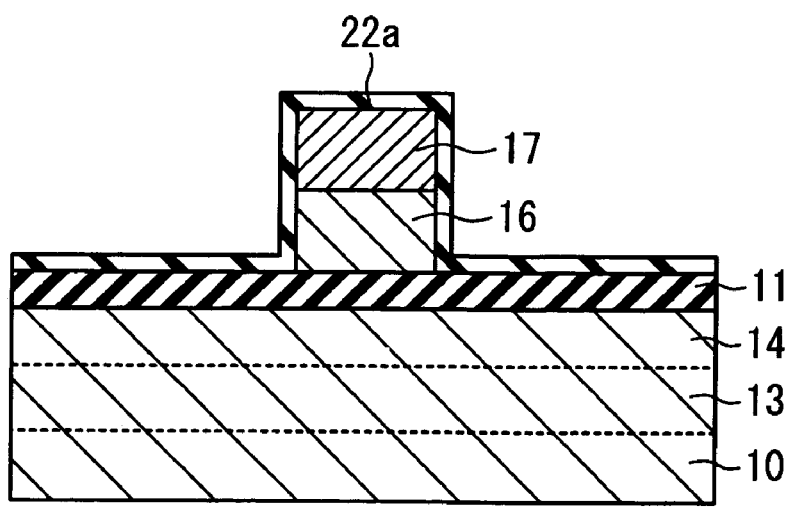
FIG. 15B is a cross sectional view of the nonvolatile memory device taken along the line A–A' in FIG. 15A.

Next, as shown in FIGS. 15A and 15B, the heights of the silicon oxide film 20a and the silicon oxide film 20c are adjusted to the height of the silicon nitride film 20b by the technique of anisotropic etching. Thus, the device separation insulating section 20 is completed. Subsequently, the silicon the oxynitride film 22a is formed by the CVD method to cover the device separation insulating section 20, the floating gate 16, and the gate insulating film 11. The film thickness of the silicon the oxynitride film 22a is 30 nm.

Next, an upper structure, the source 27 and the drain 28 are formed in accordance with the manufacturing method of the nonvolatile memory device described with reference to FIGS. 9A and 9B to FIGS. 11A and 11B. In this case, when the upper structure is formed, a step of forming the metal film 25 is not always necessary. Also, the step may be a step of forming a compound thin film of silicon and metal.

It is possible to manufacture the nonvolatile memory device of in FIGS. 12A and 12B having a small stress in the channel region 8 in accordance with the above manufacturing method. Also, in the second embodiment, it is also possible to obtain the same advantages as those described in the first embodiment.

[Third Embodiment]

Next, the nonvolatile memory device according to the third embodiment of the present invention will be described below with reference to the attached drawings.

Figure 16A:
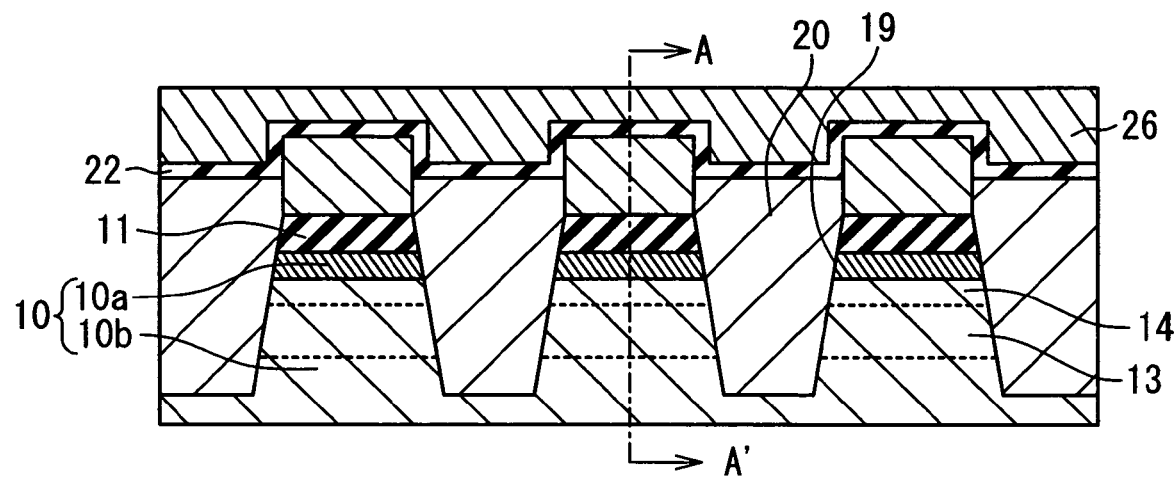
FIG. 16A is a cross sectional view of the structure of the nonvolatile memory device according to a third embodiment of the present invention.
Figure 16B:
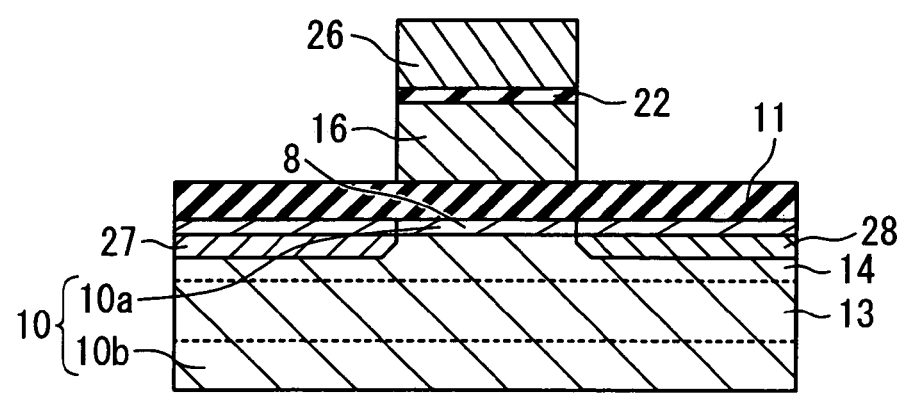
FIG. 16B is a cross sectional view of the nonvolatile memory device taken along the line A–A' in FIG. 16A.

FIG. 16A is a cross sectional view showing the structure of the nonvolatile memory device in the third embodiment of the present invention. FIG. 16B is a cross sectional view of the nonvolatile memory device taken along the line A–A' in FIG. 16A. The nonvolatile memory device has the semiconductor substrate 10, the gate insulating film 11, the floating gate 16, the interlayer insulating film 22, the control gate 26, and the device separation insulating section 20. Here, a case will be described in which the semiconductor substrate 10 is the P-type. However, the same is also applied to the case of the N-type.

Referring to FIG. 16B, the semiconductor substrate 10 includes a filmed structure of a silicon film 10a and a silicon germanium film 10b in order from the surface of the substrate 10. The silicon film 10a before the nonvolatile memory device is manufactured receives tensile stress from the silicon germanium film 10b and compressive stress generated when the nonvolatile memory device is manufactured is cancelled. Thus, it is possible to control the stress of the channel region 8. Also, the semiconductor substrate 10 has the deep N-well 13 doped with the N-type impurity and the P-well 14 doped with the P-type impurity on the surface side of the semiconductor substrate 10. The N-type source 27 and drain 28 are formed in the P-well 14 to be contact with the surface of the semiconductor substrate 10. The region between the source 27 and the drain 28 is the channel region 8 of the nonvolatile memory device. The distance between them is 150 nm.

The semiconductor substrate 10 having the filmed structure can adjust a stress to be applied to the channel region 8 by adjusting a combination of film thicknesses of the silicon germanium film 10b and the silicon film 10a and film forming condition.

The gate insulating film 11 serving as a first insulating film is formed of silicon oxide to cover at least a part of each of the channel region 8, the source 27, and the drain 28. The film thickness of the gate insulating film 11 is 10 nm such that electric charge can tunnel.

The floating gate 16 serving as an electric-charge storage film is formed of polysilicon to cover the gate insulating film 11 on the channel region 8. The film thickness of the floating gate 16 is 250 nm. The floating gate 16 has the plane size of 150×150 nm.

The interlayer insulating film 22 serving as a second insulating film is formed to cover the floating gate 16. The material of the interlayer insulating film 22 is silicon oxide or a laminated film of silicon oxide, silicon nitride, and silicon oxide. The film thickness of the interlayer insulating film 22 is 30 nm.

The control gate 26 is formed of polysilicon to cover the interlayer insulating film 22. The film thickness of the control gate 26 is 200 nm.

As shown in FIG. 16A, the device separation grooves 19 for separating adjacent devices from each other are formed in the semiconductor substrate 10 and are filled with the device separation insulating section 20. The device separation insulating section 20 is an STI (Shallow Trench Isolation) structure. The depth of the device separation groove 19 is deeper than the depth of the deep N-well 13. The device separation insulating section 20 is formed silicon oxide.

Because the characteristics shown in FIGS. 34 to 36 are the same as those of the first embodiment, description of them is omitted.

Next, the nonvolatile memory device manufacturing method according to the third embodiment of the present invention will be described below. FIGS. 17A and 17B and FIGS. 2A and 2B to FIGS. 11A and 11B are cross sectional views for showing the nonvolatile memory device manufacturing method in the third embodiment of the present invention. Here, the relation of FIG. 2A and FIG. 2B is the same as those of FIGS. 16A and 16B (FIG. 16B is a cross sectional view taken along the line in FIG. 16A). Also, FIGS. 16A and 16B are properly used for description.

Figure 17A:
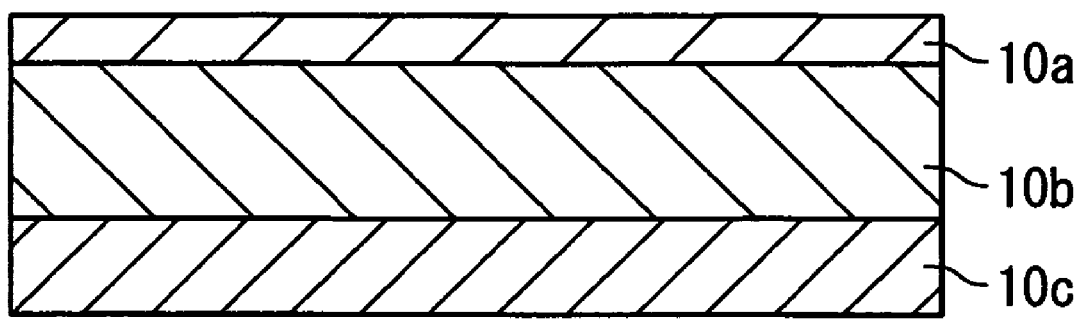
FIG. 17A is a cross sectional view of the nonvolatile memory device in the manufacturing method according to the third embodiment of the present invention.
Figure 17B:
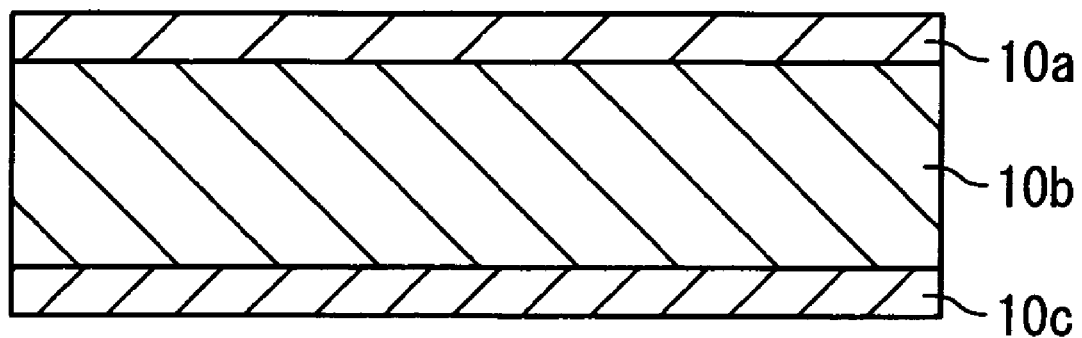
FIG. 17B is a cross sectional view of the nonvolatile memory device taken along the line A–A' in FIG. 17A.

As shown in FIGS. 17A and 17B, a silicon germanium film is epitaxially grown on a silicon substrate 10c, whose surface is cleaned, as the silicon germanium film 10b by the CVD method. In this case, the thickness of the silicon germanium film is sufficient for stress generated between the silicon germanium film and the silicon substrate 10c to be relaxed and for crystal defects produced due to the stress relaxation to be decreased up to a density in which the device manufacturing is not hindered. Subsequently, a silicon film is epitaxially grown as the silicon film 10a by the CVD method. The tensile stress generated from the difference in the lattice constant between the silicon film and the silicon germanium film is applied to the silicon film. Thus, it is possible to control the stress of the channel region 8.

Next, the nonvolatile memory device is formed on the substrate as shown in FIGS. 17A and 17B in accordance with the nonvolatile memory device manufacturing method described with reference to FIGS. 2A and 2B to FIGS. 11A and 11B in the first embodiment. In this case, a step of forming a metal film 25 is not always necessary. Also, a step of forming a compound thin film of silicon and metal may be used.

It is possible to manufacture the nonvolatile memory device of FIGS. 16A and 16B having a small stress of the channel region 8. The same advantages as those described in the first embodiment can be also obtained in the third embodiment.

[Fourth Embodiment]

Next, the nonvolatile memory device according to the fourth embodiment of the present invention will be described below with reference to the attached drawings.

Figure 18A:
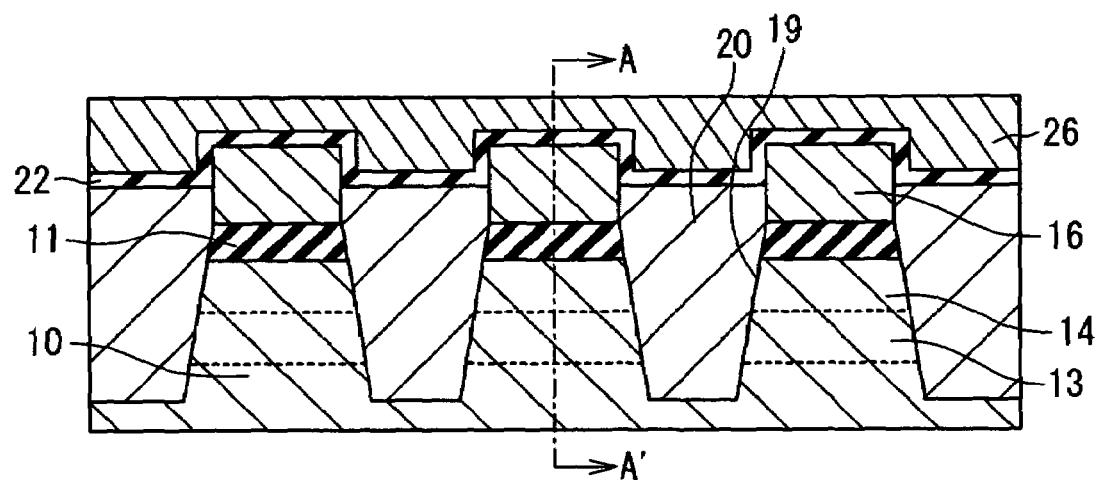
FIG. 18A is a cross sectional view showing the structure of the nonvolatile memory device according to a fourth embodiment of the present invention.
Figure 18B:
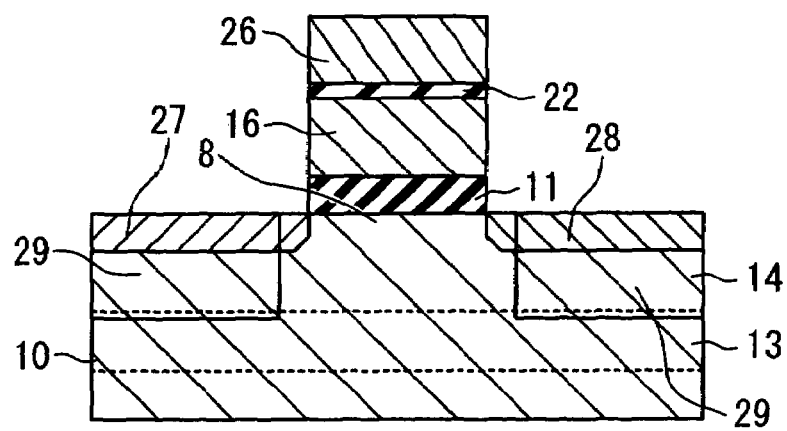
FIG. 18B is a cross sectional view of the nonvolatile memory device taken along the line A–A' in FIG. 18A.

FIGS. 18A and 18B are cross sectional views showing a structure of the fourth embodiment of the nonvolatile memory device of the present invention. FIG. 18B is a cross sectional view of the nonvolatile memory device taken along the line A–A' in FIG. 18A. The nonvolatile memory device has the silicon substrate 10, the gate insulating film 11, the floating gate 16, the interlayer insulating film 22, the control gate 26, and the device separation insulating section 20. Here, a case will be described in which the silicon substrate 10 is the P-type. However, the same is also applicable to the N-type.

Referring to FIG. 18B, the silicon substrate 10 has the deep N-well 13 doped with the N-type impurity and the P-well 14 doped with a P-type impurity on the surface side of the semiconductor substrate 10. The N-type source 27 and the drain 28 are formed in the P-well 14 to be contact with the surface of the semiconductor substrate 10. The region between the source 27 and the drain 28 is the channel region 8 of the nonvolatile memory device. The distance between them is 150 nm. A region 29 is a region formed by epitaxially growing a silicon film added with carbon after the semiconductor substrate 10 is etched. The region 29 is formed to include a part of each of the source 27 and the drain 28. By using this structure, tensile stress is applied to the channel region 8. This stress is generated due to the difference in the lattice constant between the silicon of the channel region 8 and the silicon added with the carbon of the region 29. The stress can be adjusted by changing an addition quantity of carbon, a positional relation between the region 29 and the channel 8, or a depth of the region 29. Thus, it is possible to control the stress of the channel region 8 by using the tensile stress.

The gate insulating film 11 serving as a first insulating film is formed of silicon oxide to cover at least a part of each of the channel region 8, the source 27, and the drain 28. The film thickness of the gate insulating film 11 is 10 nm such that electric charge can tunnel.

The floating gate 16 serving as an electric-charge storage film is formed of polysilicon to cover the gate insulating film 11 on the channel region 8. The film thickness of the floating gate 16 is 250 nm. The floating gate 16 has the plane size of 150×150 nm.

The polysilicon interlayer insulating film 22 serving as a second insulating film is formed to cover the floating gate 16. The polysilicon interlayer insulating film 22 is formed of silicon oxynitride or from a laminated film of silicon oxide, silicon nitride, and silicon nitride to have the film thickness of 30 nm.

The control gate 26 is formed of polysilicon to cover the polysilicon interlayer insulating film 22. The film thickness of the control gate 26 is 200 nm.

Referring to FIG. 18A, the device separation grooves 19 for separating adjacent devices from each other are formed in the semiconductor substrate 10 and are filled with the device separation insulating sections 20. The device separation insulating section 20 has an STI (Shallow Trench Isolation) structure. The depth of the device separation insulating section 20 is deeper than that of the deep N-well 13. The material of the device separation insulating section 20 is silicon oxide.

Because the characteristics shown in FIGS. 34 to 36 are the same as those of the first embodiment, description of them is omitted.

Next, the nonvolatile memory device manufacturing method according to the fourth embodiment of the present invention will be described below. FIGS. 2A and 2B to FIGS. 10A and 10B, and FIGS. 19A and 19B to FIGS. 22A and 22B are cross sectional views for showing the nonvolatile memory device manufacturing method in the fourth embodiment of the present invention. Here, the relation between FIG. 18A and FIG. 18B is the same to those of the other figures (FIG. 18B is a cross sectional view of the nonvolatile memory device taken along the line A–A' in FIG. 18a). FIGS. 18A and 18B are properly used for description.

First, the control gate 26 shown in FIGS. 2A and 2B to FIGS. 10A and 10B is formed in accordance with the nonvolatile memory device manufacturing method in the first embodiment. In this case, a step of forming the metal film 25 is not always necessary. Also, a step of forming a compound thin film of silicon and metal may be used.

Figure 19A:
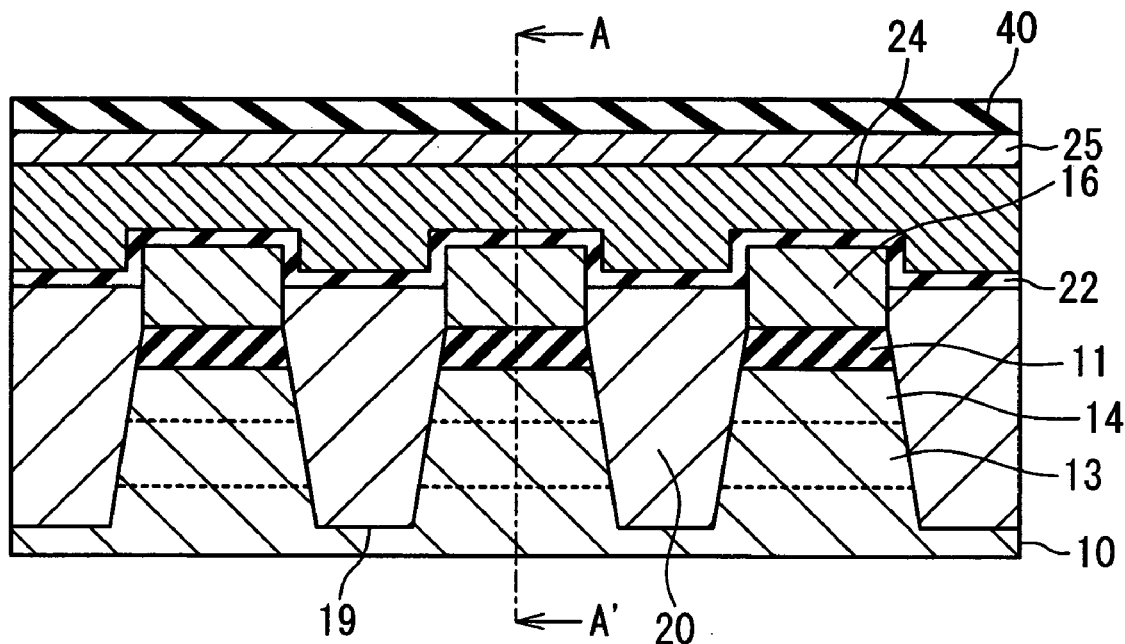
FIG. 19A is a cross sectional view of the nonvolatile memory device in the manufacturing method according to the fourth embodiment of the present invention.
Figure 19B:
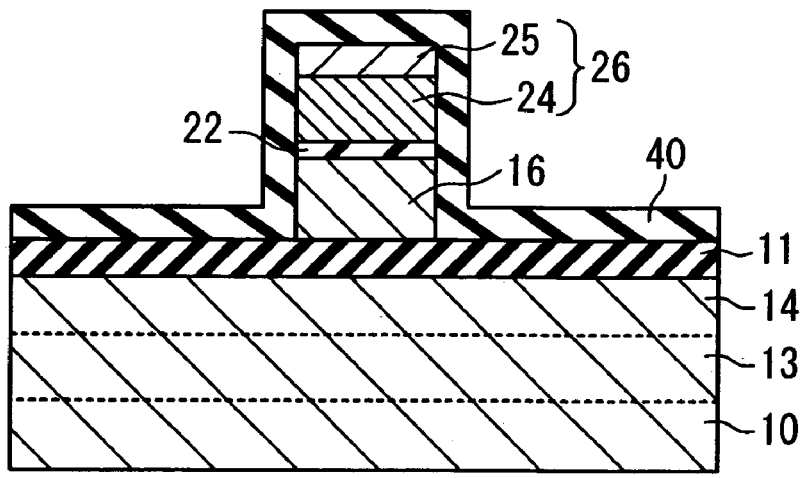
FIG. 19B is a cross sectional view of the nonvolatile memory device taken along the line A–A' in FIG. 19A.

Next, as shown in FIGS. 19A and 19B, the silicon oxide film 40 is formed by the CVD method to cover the floating gate 16, the interlayer insulating film 22, the control gate 26, and the gate insulating film 11.

Figure 20A:
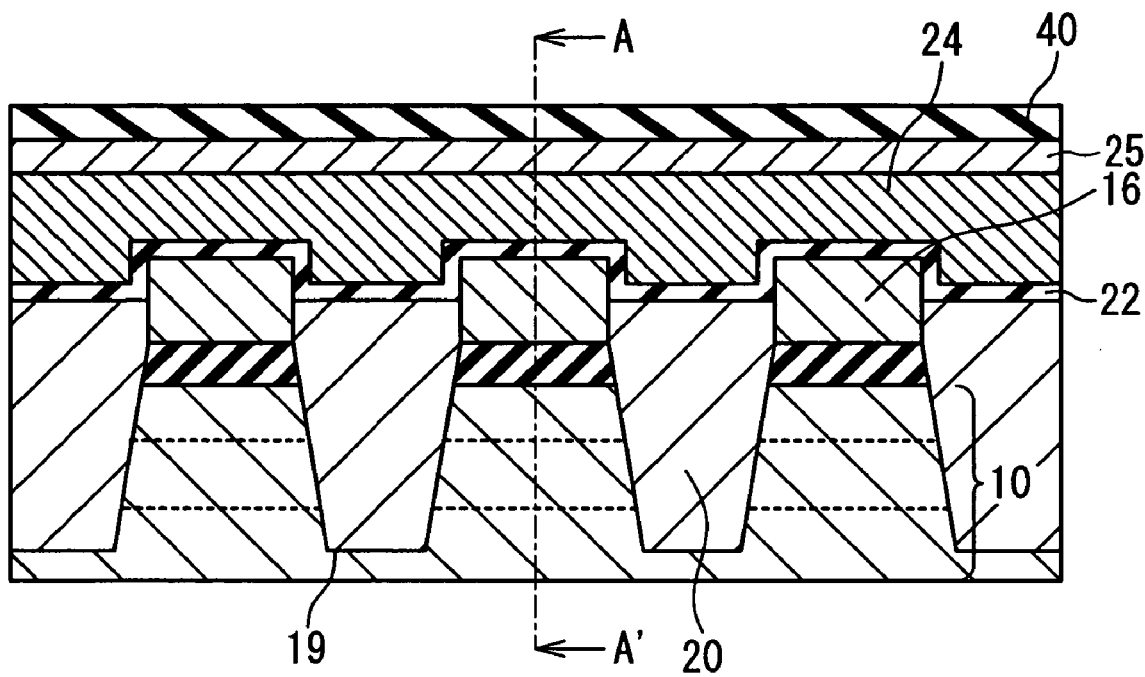
FIG. 20A is a cross sectional view of the nonvolatile memory device in the manufacturing method according to the fourth embodiment of the present invention.
Figure 20B:
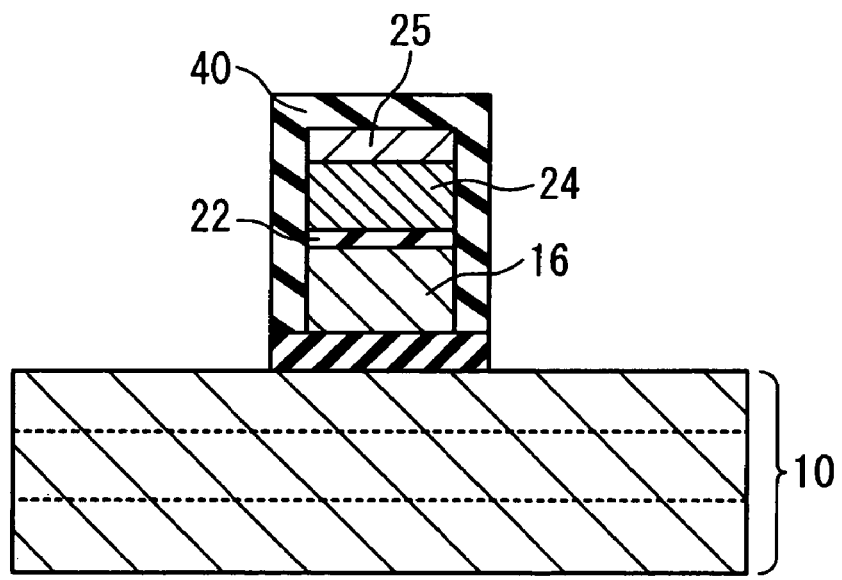
FIG. 20B is a cross sectional view of the nonvolatile memory device taken along the line A–A' in FIG. 20A.

Next, as shown in FIGS. 20A and 20B, the silicon oxide film 40 and the gate insulating film 11 are patterned by the techniques of photolithography and etching.

Figure 21A:
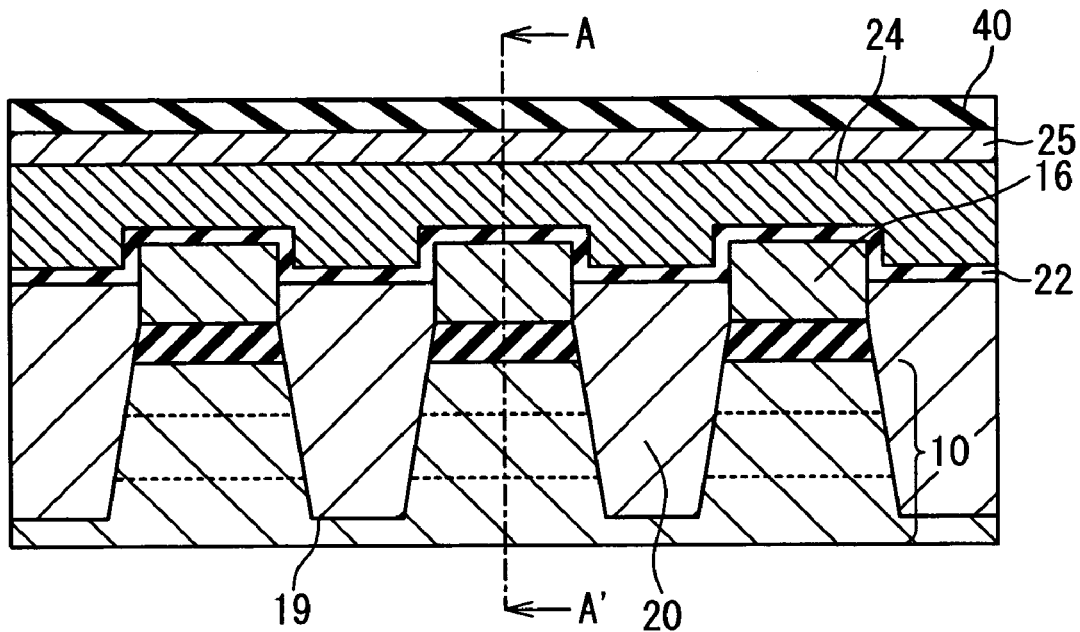
FIG. 21A is a cross sectional view of the nonvolatile memory device in the manufacturing method according to the fourth embodiment of the present invention.
Figure 21B:
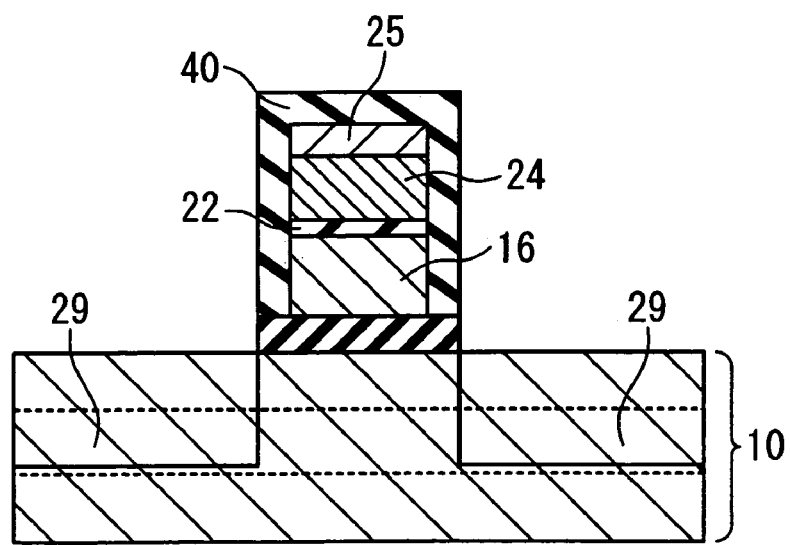
FIG. 21B is a cross sectional view of the nonvolatile memory device taken along the line A–A' in FIG. 21A.

Next, as shown in FIGS. 21A and 21B, the semiconductor substrate 10 is dry-etched by using the silicon oxide film 40 as a mask. Also, after the surface of the etched semiconductor substrate 10 is cleaned, a silicon film 29 added with carbon is formed only in an etched region of the semiconductor substrate by the technique of selective epitaxial growth. The tensile stress is applied to the channel region in accordance with the difference in the lattice constant between the silicon film 29 added with carbon and the semiconductor substrate 10. It is possible to control the stress of the channel region in accordance with the above tensile stress. Also, it is possible to control the stress applied to the channel region in accordance with the quantity of carbon to be added.

Figure 22A:
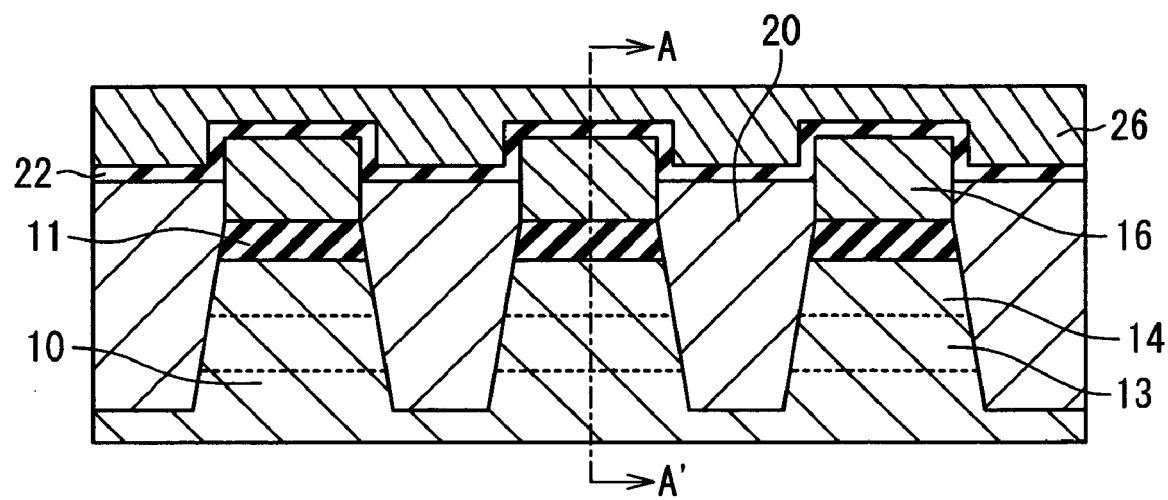
FIG. 22A is a cross sectional view of the nonvolatile memory device in the manufacturing method according to the fourth embodiment of the present invention.
Figure 22B:
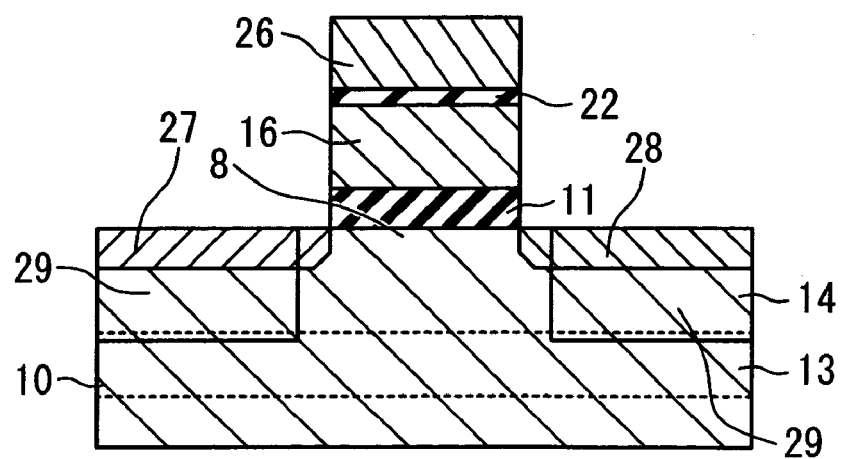
FIG. 22B is a cross sectional view of the nonvolatile memory device taken along the line A–A' in FIG. 22A.

Next, as shown in FIGS. 22A and 22B, the silicon oxide film is removed by etching. Subsequently, the N-type impurity is ion-implanted by using the control gate 26 as a mask. Then, the source 27 and drain 28 are formed by heat treatment.

According to the above manufacturing method, it is possible to manufacture the nonvolatile memory device having a small stress of the channel region 8, as shown in FIGS. 18A and 18B. Also, as seen from the fourth embodiment, it is possible to obtain the same advantages as those in the first embodiment.

[Fifth Embodiment]

Next, the nonvolatile memory device according to the fifth embodiment of the present invention will be described below with reference to the attached drawings.

Figure 23A:
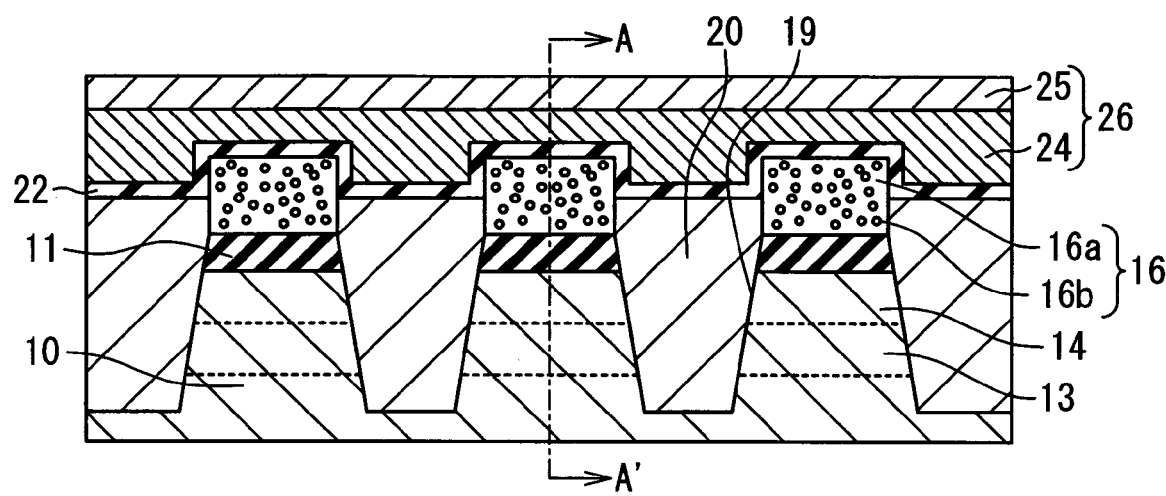
FIG. 23A is a cross sectional view showing the structure of the nonvolatile memory device according to a fifth embodiment of the present invention.
Figure 23B:
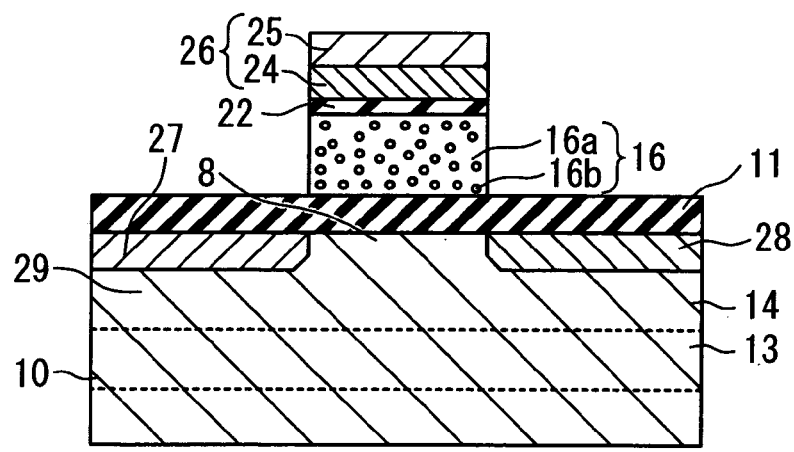
FIG. 23B is a cross sectional view of the nonvolatile memory device taken along the line A–A' in FIG. 23A.

FIG. 23A is a cross sectional view showing the structure of the nonvolatile memory device in the fifth embodiment of the present invention. FIG. 23B is a cross sectional view of the nonvolatile memory device taken along the line A–A' in FIG. 23A. The nonvolatile memory device has the silicon substrate 10, the gate insulating film 11, the electric-charge storage insulating film 16, the interlayer insulating film 22, the control gate 26, and the device separation insulating section 20. Here, a case will be described in which the conductivity type of the semiconductor substrate 10 is the P-type. However, the same can be applicable to the N-type.

Referring to FIG. 23B, the semiconductor substrate 10 has the deep N-well 13 doped with the N-type impurity and the P-well 14 doped with the P-type impurity on the surface side of the semiconductor substrate 10. The N-type source 27 and the drain 28 are formed in the P-well 14 to be contact with the surface of the semiconductor substrate 10. The region between the source 27 and the drain 28 is the channel region 8 of the nonvolatile memory device. The distance between them is 150 nm.

The gate insulating film 11 is formed of silicon oxide to cover at least a part of each of the channel region 8, the source 27, and the drain 28. The film thickness of the gate insulating film 11 is 1.5 nm such that electric charge can tunnel.

The electric-charge storage insulating film 16 is formed on the gate insulating film 11 above the channel region 8. The electric-charge storage insulating film 16 is formed of a silicon oxide film 16a containing fine silicon particles 16b. The thickness of the silicon oxide film 16a is 250 nm. The particle diameter of the fine silicon particle 16b is 5 nm. The electric-charge storage insulating film 16 has the plane size 150×150 nm.

The interlayer insulating film 22 is formed of silicon oxide to cover the electric-charge storage insulating film. The film thickness of the interlayer insulating film 22 is 7 nm.

The control gate 26 is formed to cover the interlayer insulating film 22. The control gate 26 has the metal film 25 and the polysilicon film 24. The polysilicon film 24 is formed to cover the polysilicon-layer insulating film 22. The film thickness of the polysilicon film 24 is 100 nm. The metal film 25 is formed to cover the polysilicon film 24. The metal film 25 applies the tensile stress to the channel region 8 to relax the compressive stress of the channel region 8. The thickness of the metal film 26 is 150 nm. The metal film 25 is formed of tungsten, tantalum, molybdenum, or nitride of any one of them.

By adjusting the thickness and material of the metal film 25, it is possible to obtain a desired tensile stress. Moreover, by adjusting the composition of the above tungsten and the like and the nitride of any one of them, a desired tensile stress can be obtained. Thus, it is possible to relax the compressive stress of the channel region 8 in accordance with the compressive stress.

As shown in FIG. 23A, the device separation grooves 19 for separating adjacent devices from each other are formed in the semiconductor substrate 10 and are filled with the device separation insulating sections 20. The device separation insulating section 20 has an STI (Shallow Trench Isolation) structure. The depth of the device separation insulating sections 20 is deeper than that of the N-well 13 and the device separation insulating section 20 is formed of silicon oxide.

Since the characteristics shown in FIGS. 34 to 36 ate the same as those of the first embodiment, description of them is omitted.

Because the nonvolatile memory device manufacturing method in the fifth embodiment of the present invention is the same as the first embodiment except that the material of the electric-charge storage insulating film 16 is different, its description is omitted. However, it is possible to form the electric-charge storage insulating film 16 by applying and burning the slurry of silicon oxide in which fine silicon particles are dispersed.

The same advantages as in the first embodiment can be also obtained in the fifth embodiment.

Figure 37A:
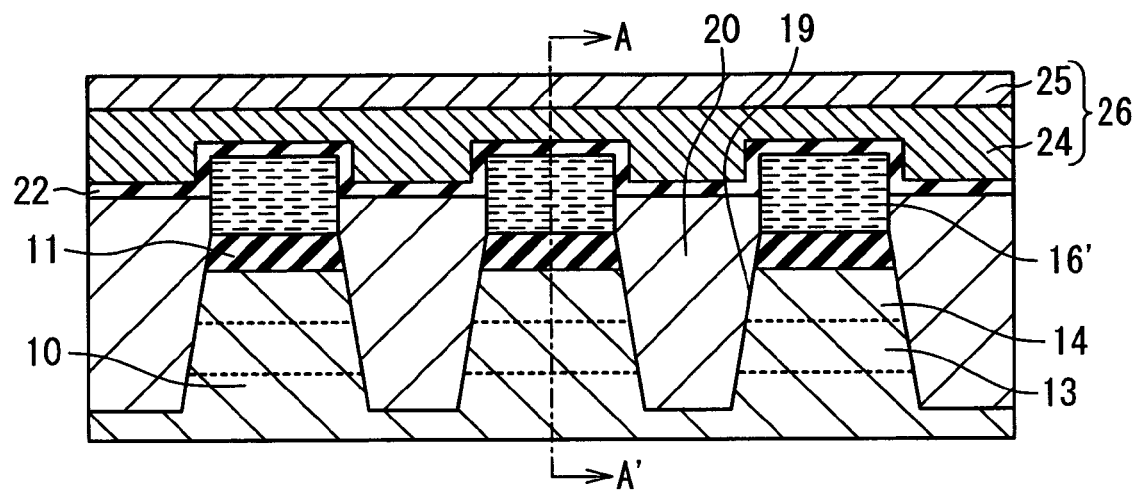
FIG. 37A is a cross sectional view showing the structure of a modification of the nonvolatile memory device according to the fifth embodiment of the present invention.
Figure 37B:
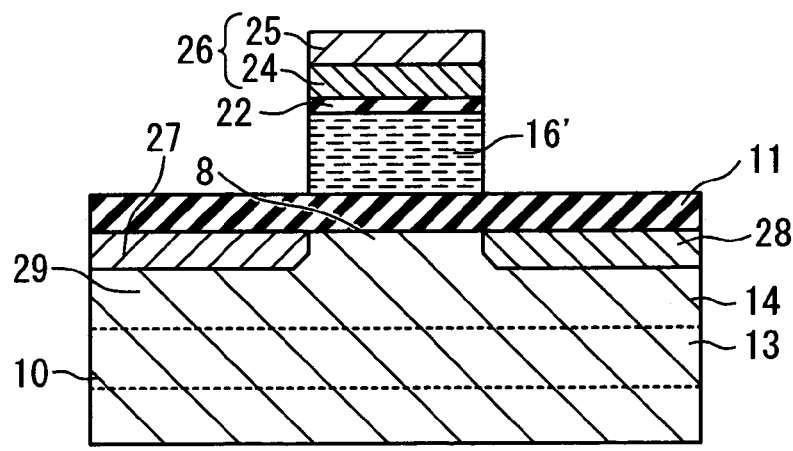
FIG. 37B is a cross sectional view of the modification of the nonvolatile memory device taken along the line A–A' in FIG. 37A.

Here, a charge storage insulating film 16' containing electric charge trap centers may be used as a dielectric film in place of the electric-charge storage insulating film 16, as shown in FIGS. 37A and 37B. In this case, the polysilicon-layer insulating film 22 may be omitted.

[Sixth Embodiment]

Next, the nonvolatile memory device of according to the sixth embodiment of the present invention will be described below with reference to the attached drawings.

Figure 24A:
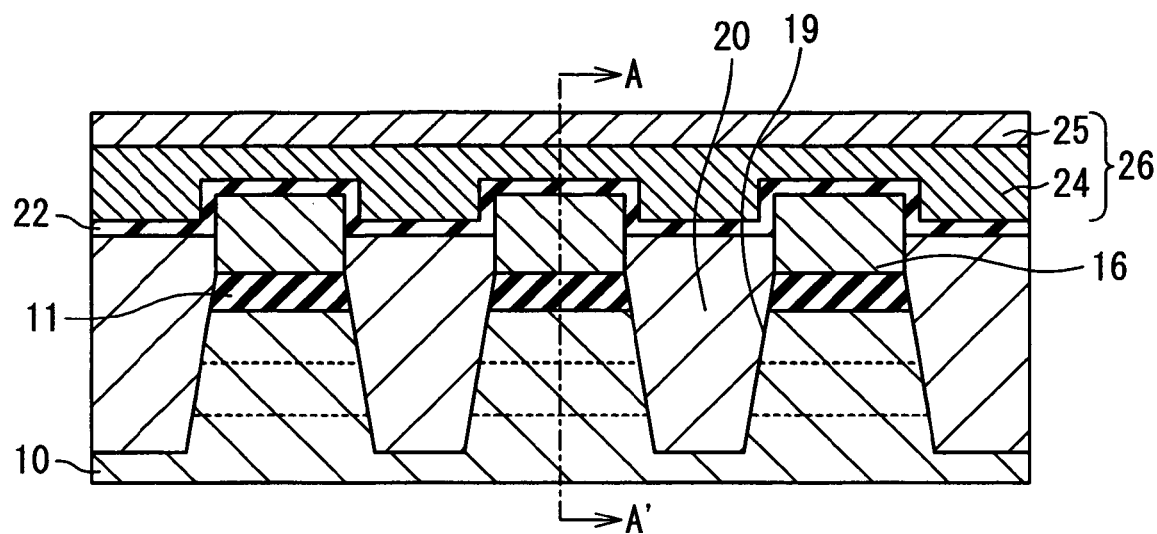
FIG. 24A is a cross sectional view showing the structure of the nonvolatile memory device according to a sixth embodiment of the present invention.
Figure 24B:
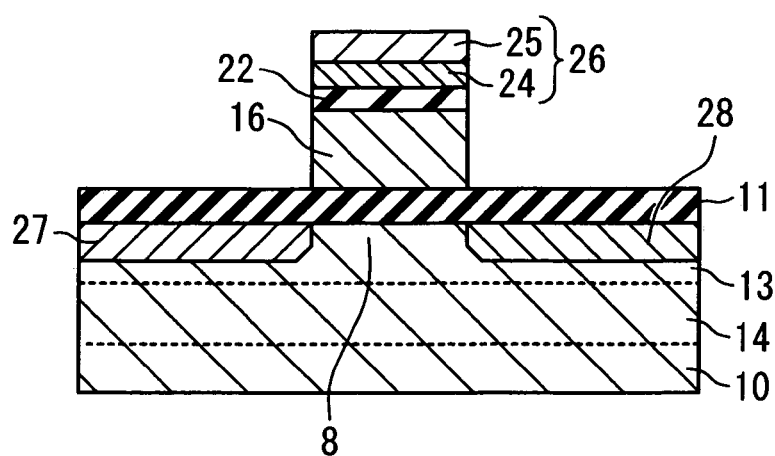
FIG. 24B is a cross sectional view of the nonvolatile memory device taken along the line A–A' in FIG. 24A.

FIG. 24A is a cross sectional view showing the structure of the nonvolatile memory device according to the sixth embodiment of the present invention. FIG. 24B is a cross sectional view of the nonvolatile memory device taken along the line A–A' in FIG. 24A. The nonvolatile memory device has the silicon substrate 10, the gate insulating film 11, the electric-charge storage insulating film 16, the interlayer insulating film 22, the control gate 26, and the device separation insulating section 20. Here, a case will be described in which the conductivity type of the semiconductor substrate 10 is the P-type. However, the same can be also applicable to the N-type.

Referring to FIG. 24B, the semiconductor substrate 10 has the deep N-well 13 doped with the N-type impurity and the P-well 14 doped with the P-type impurity on the surface side of the semiconductor substrate 10. The N-type source 27 and the drain 28 are formed in the P-well 14 to be contact with the surface of the semiconductor substrate 10. The region between the source 27 and the drain 28 is the channel region of the nonvolatile memory device. The distance between them is 150 nm.

The gate insulating film 11 is formed of silicon oxide to cover at least a part of each of the channel region 8, the source 27, and the drain 28. The gate insulating film 11 is formed to have the film thickness of 7 nm such that electric charge can tunnel.

The electric-charge storage insulating film 16 is formed on the gate insulating film 11 above the channel region 8. The electric-charge storage insulating film 16 is formed of any one of silicon nitride, aluminum oxide, oxynitriding aluminum, hafnium oxide, oxynitriding hafnium, oxynitriding silicon hafnium, zirconium oxide, oxynitriding zirconium, and oxynitriding silicon zirconium. The electric-charge storage film 16 formed by any one of these materials includes the electric-charge capturing center. The electric-charge storage insulating film 16 is formed to have the film thickness of 10 nm. The electric-charge storage insulating film 16 has the plane size of 150×150 nm.

The interlayer insulating film 22 is formed of silicon oxide on the electric-charge storage insulating film 16. The interlayer insulating film 22 is formed to have the film thickness of 7 nm.

The control gate 26 is formed to cover the interlayer insulating film 22. The control gate 26 has the metal film 25 and the polysilicon film 24. The polysilicon film 24 is formed to cover the polysilicon interlayer insulating film 22. The polysilicon film 24 is formed to have the film thickness of 100 nm. The metal film 25 is formed to cover the polysilicon film 26. The metal film 25 applies the tensile stress to the channel region 8 to relax the compressive stress of the channel region 8. The thickness of the metal film 25 is 150 nm. The metal film 25 is formed of any one of tungsten, tantalum, molybdenum, nitride of any one of them, or a combination (lamination) of them.

Referring to FIG. 24A, the device separation grooves 19 for separating adjacent devices from each other are formed in the semiconductor substrate 10 and are filled with the device separation insulating sections 20. The device separation insulating section 20 has an STI (Shallow Trench Isolation) structure. The depth of the device separation insulating sections 20 is deeper than that of the N-well 13 and the device separation insulating sections 20 is formed of silicon oxide.

Since the characteristics shown in FIGS. 34 to 36 are the same as those of the first embodiment, description of them is omitted.

The manufacturing method of the nonvolatile memory device in the sixth embodiment of the present invention is the same as that of the first embodiment except that the material of the electric-charge storage insulating film 16 is different, and therefore its description is omitted.

The same advantages as those of the first embodiment can be also obtained in the sixth embodiment.

[Seventh Embodiment]

Next, the nonvolatile memory device according to the seventh embodiment of the present invention will be described below with reference to the attached drawings.

Figure 25A:
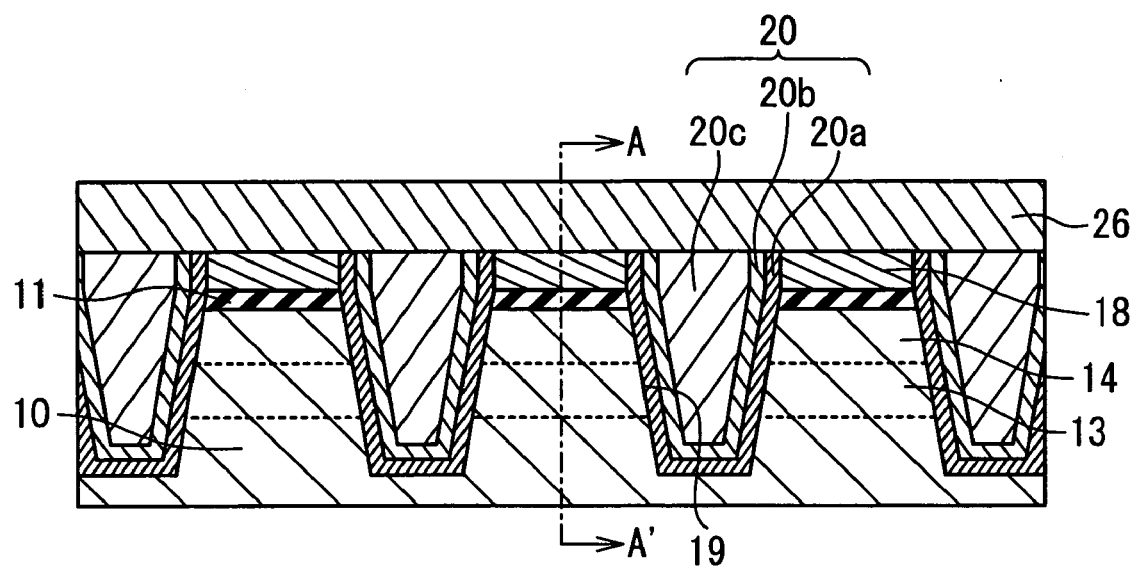
FIG. 25A is a cross sectional view showing the structure of the nonvolatile memory device according to a seventh embodiment of the present invention.
Figure 25B:
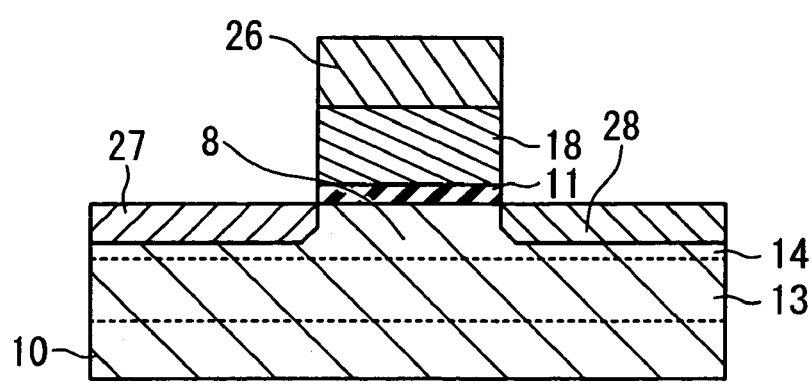
FIG. 25B is a cross sectional view of the nonvolatile memory device taken along the line A–A' in FIG. 25A.

FIG. 25A is a cross sectional view showing the structure of the seventh embodiment of the nonvolatile memory device of the present invention. FIG. 25B is a cross sectional view of the nonvolatile memory device taken along the line A–A' in FIG. 25A. The nonvolatile memory device has the semiconductor substrate 10, the gate insulating film 11, the ferroelectric film 18, the control gate 26, and the device separation insulating section 20. In this case, a case will be described in which the conductivity type of the semiconductor substrate 10 is the P-type. However, the same is applicable to the N-type. Also, the ferroelectric film 18 may be a thin film having a laminated structure of metal and ferroelectric substance in order from the side of the gate insulating film 11.

Referring to FIG. 25B, the semiconductor substrate 10 has the deep N-well 13 doped with the N-type impurity and the P-well 14 doped with the P-type impurity on the surface side of the semiconductor substrate 10. The N-type source 27 and the drain 28 are formed in the P-well 14 to be contact with the surface of the semiconductor substrate 10. The region between the source 27 and the drain 28 is the channel region 8 of the nonvolatile memory device. The distance between them is 150 nm.

The gate insulating film 11 serving as a first insulating film is formed of hafnium oxide to cover at least a part of each of the channel region 8, the source 27, and the drain 28. The gate insulating film 11 is formed to have the film thickness of 8 nm.

The ferroelectric film 18 serving as an electric-charge storage film is formed of tantalic-acid bismuthate strontium on the gate insulating film 11 above the channel region 8. The ferroelectric film 18 serving is formed to have the film thickness of 250 nm. The ferroelectric film 18 has the plane size of 150×150 nm. Also, a metal film (not shown) may be present between the gate insulating film 11 and the ferroelectric film 18.

The control gate 26 is formed of ruthenium on the ferroelectric film 16. The control gate 26 is formed to have the film thickness of 100 nm.

Referring to FIG. 25A, the device separation grooves 19 for separating adjacent devices from each other are formed in the semiconductor substrate 10 and are filled with the device separation insulating sections 20. The device separation insulating section 20 has an STI (Shallow Trench Isolation) structure of a filmed structure of silicon oxide 20a, silicon nitride 20b, and silicon oxide 20c. The depth of the device separation insulating section 20 is deeper than that of the deep N-well 13. The thicknesses of the silicon oxide 20a and the silicon nitride 20b are 10 nm and 3 nm, respectively. It is possible to control the stress of the channel region similarly to the case of the second embodiment by the STI structure of the filmed structure.

Because the characteristics of FIGS. 34 to 36 are the same as those of the first embodiment, description of them is omitted.

The description of the nonvolatile memory device in the seventh embodiment of the present invention is omitted, because the seventh embodiment is the same as the second embodiment except that the interlayer insulating film 22 is not formed.

The same advantages as those of the first embodiment can be also obtained in the seventh embodiment.

[Eighth Embodiment]

Next, the nonvolatile memory device according to the eighth embodiment of the present invention will be described below with reference to the attached drawings.

Figure 26A:
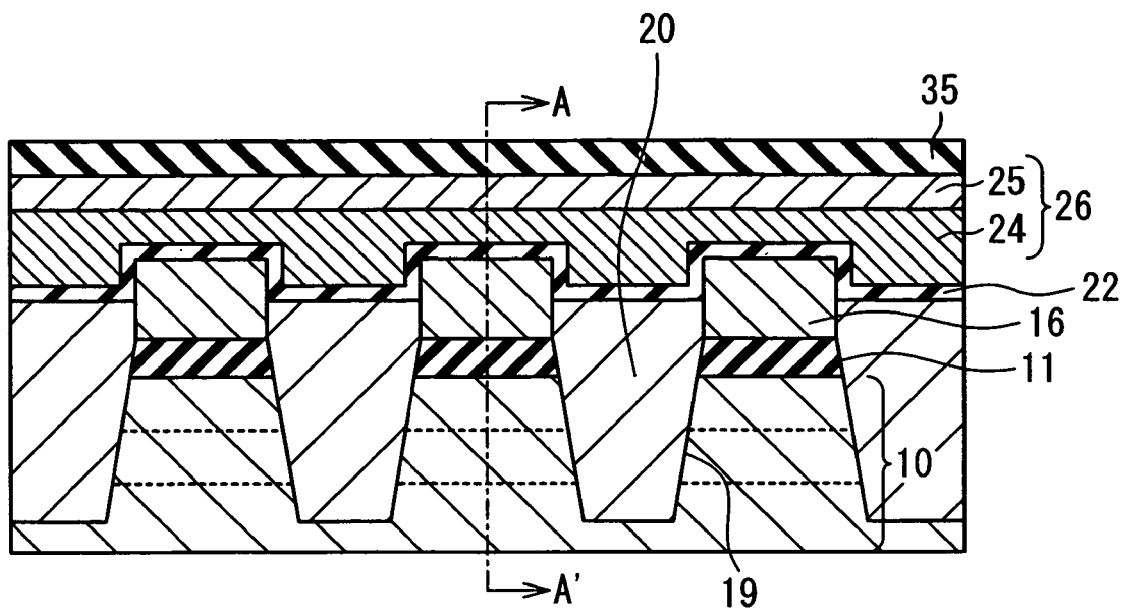
FIG. 26A is a cross sectional view showing the structure of the nonvolatile memory device according to an eighth embodiment of the present invention.
Figure 26B:
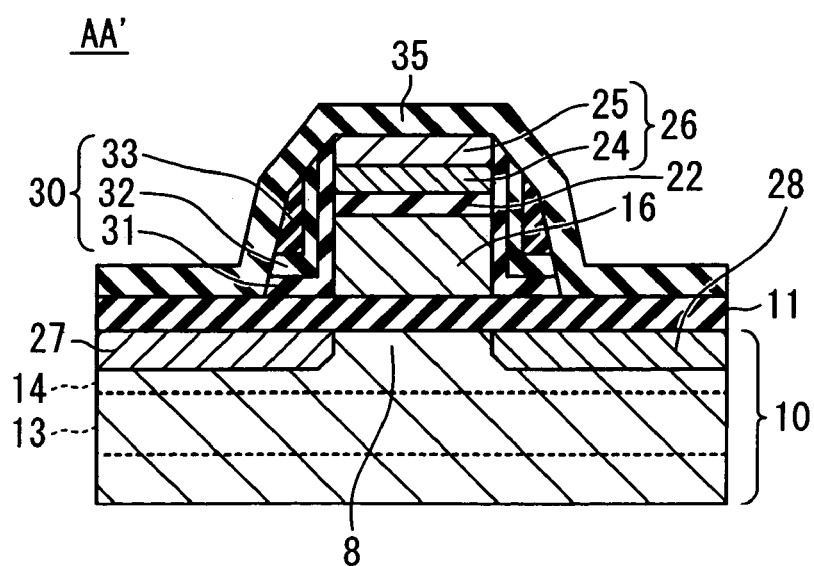
FIG. 26B is a cross sectional view of the nonvolatile memory device taken along the line A–A' in FIG. 26A.

FIG. 26A is a cross sectional view showing the structure of the nonvolatile memory device according to the eighth embodiment of the present invention. FIG. 26B is a cross sectional view of the nonvolatile memory device taken along the line A–A' in FIG. 26A. The nonvolatile memory device has the semiconductor substrate 10, the gate insulating film 11, the floating gate 16, the polysilicon interlayer insulating film 22, the control gate 26, the sidewall 30, the film insulating film 35, and the device separation insulating section 20. In this case, through a case will be described in which the conductivity type of the semiconductor substrate 10 is the P-type, the same can be applicable to the N-type.

Referring to FIG. 26B, the semiconductor substrate 10 has the deep N-well 13 doped with the N-type impurity and the P-well 14 doped with the P-type impurity on the surface side of the semiconductor substrate 10. The N-type source 27 and the drain 28 are formed in the P-well 14 in contact with the surface of the semiconductor substrate 10. The region between the source 27 and the drain 28 is the channel region of the nonvolatile memory device. The distance between them is 150 nm.

The gate insulating film 11 serving as a first insulating film is formed of silicon oxide to cover at least a part of each of the channel region 8, the source 27, and the drain 28. The gate insulating film 11 is formed to have the film thickness of 10 nm such that electric charge can tunnel.

The floating gate 16 serving as an electric-charge storage film is formed of polysilicon to cover the gate insulating film 11 on the channel region 8. The floating gate 16 serving is formed to have the film thickness of 250 nm. The floating gate 16 serving has the plane size of 150×150 nm.

The polysilicon interlayer insulating film 22 serving as a second insulating film is formed to cover the floating gate 16. The polysilicon interlayer insulating film 22 is formed of silicon oxynitride or from a laminated film of silicon oxide, silicon nitride, and silicon oxide. The polysilicon interlayer insulating film 22 is formed to have the film thickness of 30 nm.

The control gate 26 is formed to cover the polysilicon interlayer insulating film 22. The control gate 26 has the silicide film 25 and the polysilicon film 24. The polysilicon film 24 is formed to cover the polysilicon interlayer insulating film 22. The polysilicon film 24 is formed to have the film thickness of 200 nm. The silicide film 25 is formed of $CoSi_2$ to cover the polysilicon film 24. The silicide film 25 is formed to have the film thickness of 100 nm.

The sidewall 30 is formed to cover each side of the floating gate 16, the polysilicon interlayer insulating film 22, and the control gate 26 so that the lower portion of the sidewall 30 is contact with the gate insulating film 11. The sidewall 30 has the tensile stress. It is possible to relax the compressive stress of the channel region 8 with the tensile stress. Particularly, the tensile stresses in a portion contacting the gate insulating film 11 and a portion almost parallel to the gate insulating film 11 respectively have a large effect. The sidewall 30 has the first sidewall insulating film 31, the second sidewall insulating film 32, and the third sidewall insulating film 33.

The first sidewall insulating film 31 covers sides of the floating gate 16, the polysilicon interlayer insulating film 22, and the control gate 26 and the lower portion of the film 31 is formed to be contact with the gate insulating film 11. The first sidewall insulating film 31 is formed of silicon oxide to have the film thickness of 10 nm. The manufacturing method is the CVD method such as the reduced-pressure CVD method.

The second sidewall insulating film 32 is formed to cover the surface of the first sidewall insulating film 31. For example, the film 32 is a film including at least one of a silicon nitride (SiN) film, SiON film, SiCN film, AlO film, and AlSiN film. The manufacturing method is the reduced-pressure CVD method. It is preferable that the film formation temperature ranges of 600° C. to 900° C. In this range, it is possible to make the film have the tensile stress. The second sidewall insulating film 32 is formed to have the film thickness of 10 nm.

The third sidewall insulating film 33 is formed of silicon oxide to cover the surface of the second sidewall insulating film 32. The manufacturing method is the CVD method such as the reduced-pressure CVD method. The third sidewall insulating film 33 is formed to have the film thickness of 20 nm. At least one of the first sidewall insulating film 31, the second sidewall insulating film 32, and the third sidewall insulating film 33 can relax the compressive stress of the channel region 8 since particularly having the tensile stress in the direction almost parallel to the surface of the semiconductor substrate 10.

The interlayer insulating film 35 serving as a third insulating film is formed to cover the gate insulating film 11, the sidewall 30, and the control gate 26. The film 35 is formed from a film including at least one of silicon nitride, SiON film, SiCN film, AlO film, and AlSiN film. The manufacturing method is the CVD method such as the reduced-pressure CVD method. A source gas is silane or dichlorosilane. It is preferable that the film formation temperature is in a range from 600° C. to 900° C. (condition for the film having the tensile stress) from the viewpoint of the film quality. The interlayer insulating film 35 is formed to have the film thickness of 200 nm. Also, the film may be formed by the CVD method by using monomethylsilane and hydrazine as source gases. The interlayer insulating film 35 has the tensile stress, and is possible to relax the compressive stress of the channel region 8 with the tensile stress.

Referring to FIG. 26A, the device separation grooves 19 for separating adjacent devices from each other are formed in the semiconductor substrate 10 and are filled with the device separation insulating sections 20. The device separation insulating section 20 has an STI (Shallow Trench Isolation) structure. The depth of the device separation insulating section 20 is deeper than that of the deep N-well 13. The device separation insulating section 20 is formed of silicon oxide.

Because the characteristics of FIGS. 34 to 36 are the same as the case of the first embodiment, description of them is omitted.

Next, the nonvolatile memory device manufacturing method according to the eighth embodiment of the present invention will be described below. FIGS. 2A and 2B to FIGS. 8A and 8B, FIGS. 27A and 27B to FIGS. 33A and 33B are cross sectional views for showing the nonvolatile memory device manufacturing method according to the eighth embodiment of the present invention. Here, the relation between FIGS. 27A and 27B is the same as in the other figures (FIG. 26B is a cross sectional view taken along the line A–A' in FIG. 26A).

First, the process until the formation of the silicon oxynitride film 22a shown in FIGS. 2A and 2B to FIGS. 8A and 8B is carried out in accordance with the nonvolatile memory device manufacturing method in the first embodiment.

Figure 27A:
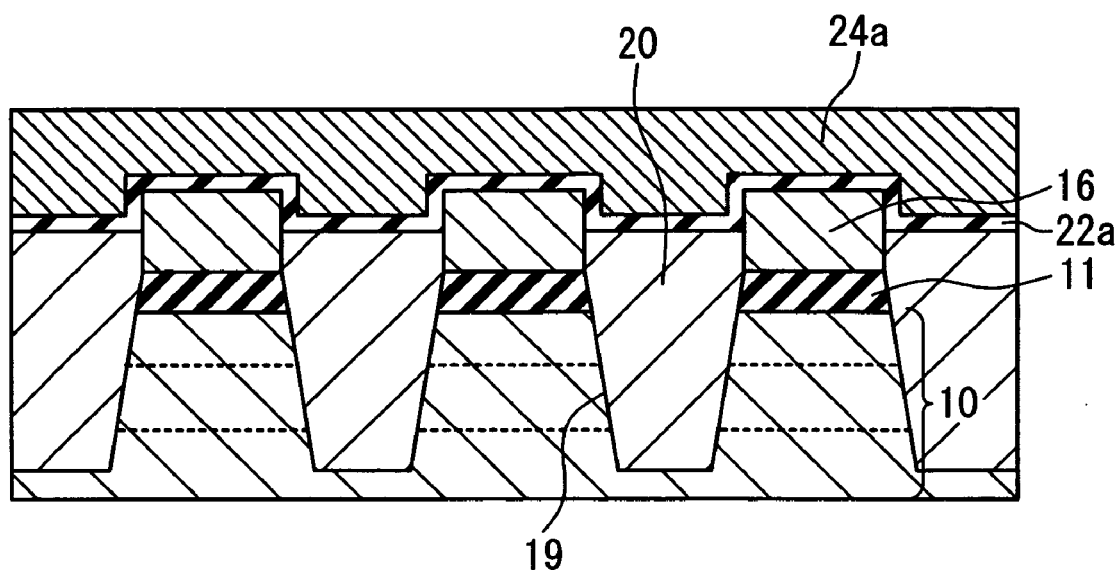
FIG. 27A is a cross sectional view of the nonvolatile memory device in the manufacturing method according to the fourth embodiment of the present invention.
Figure 27B:
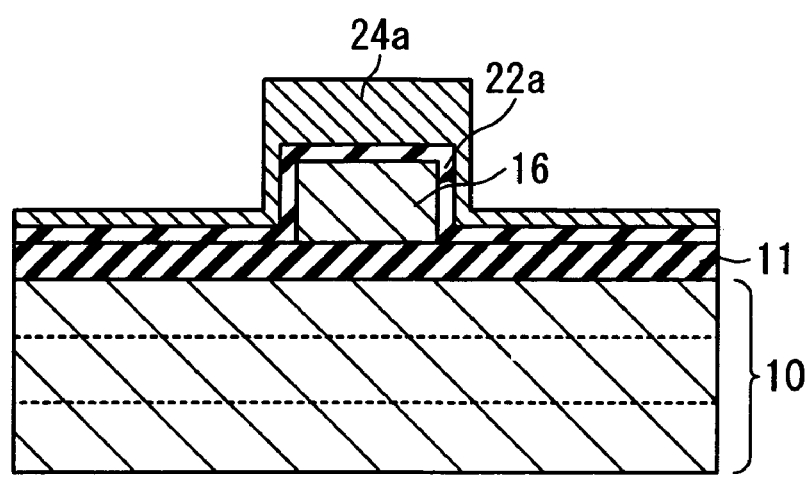
FIG. 27B is a cross sectional view of the nonvolatile memory device taken along the line A–A' in FIG. 27A.

Next, as shown in FIGS. 27A and 27B, the polysilicon film 24a is formed to have the film thickness of 300 nm by the CVD method and to cover the silicon oxynitride film 22a.

Figure 28A:
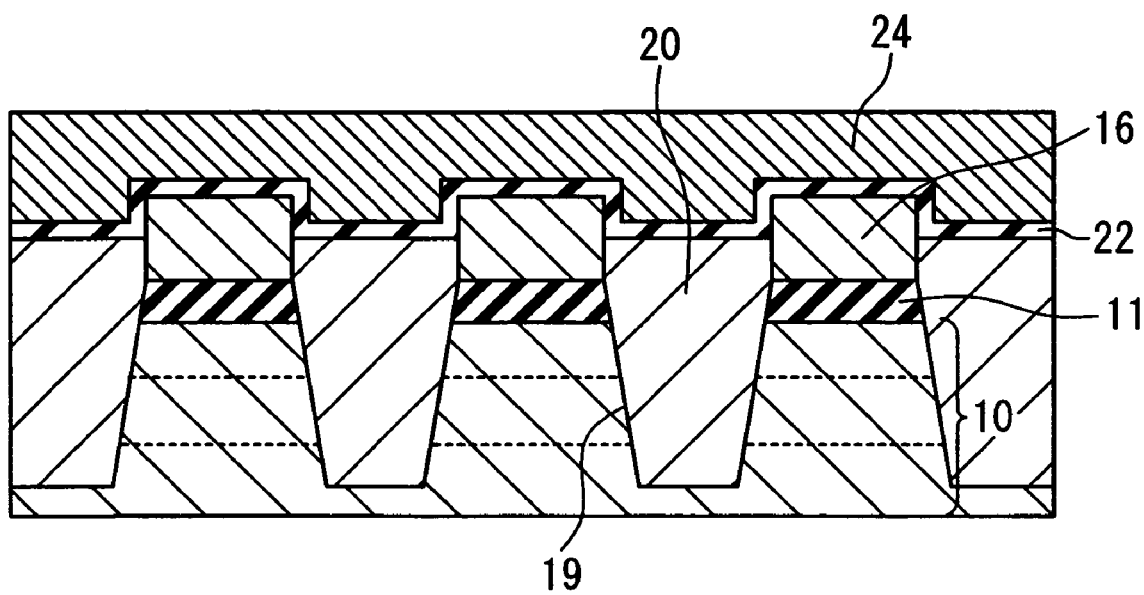
FIG. 28A is a cross sectional view of the nonvolatile memory device in the manufacturing method according to the fourth embodiment of the present invention.
Figure 28B:
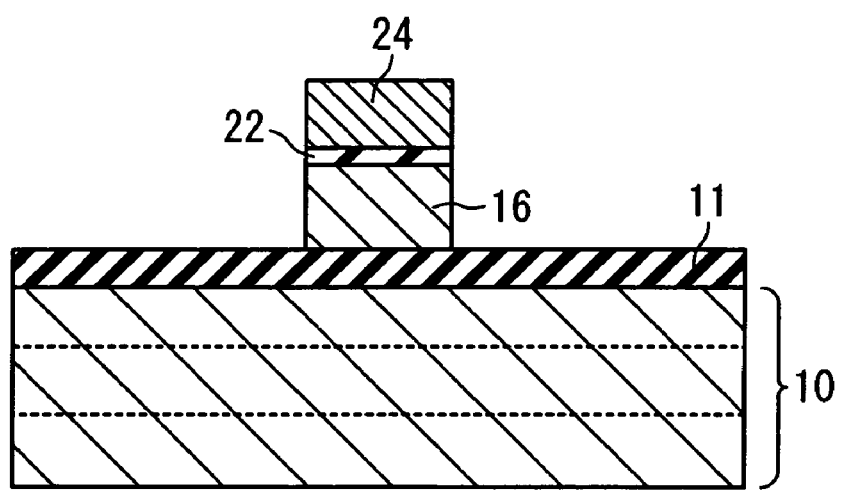
FIG. 28B is a cross sectional view of the nonvolatile memory device taken along the line A–A' in FIG. 28A.

Next, as shown in FIGS. 28A and 28B, the oxynitriding silicon film 22a and the polysilicon film 24a are patterned by the techniques of photolithography and etching to form the polysilicon film 24 and the polysilicon interlayer insulating film 22.

Figure 29A:
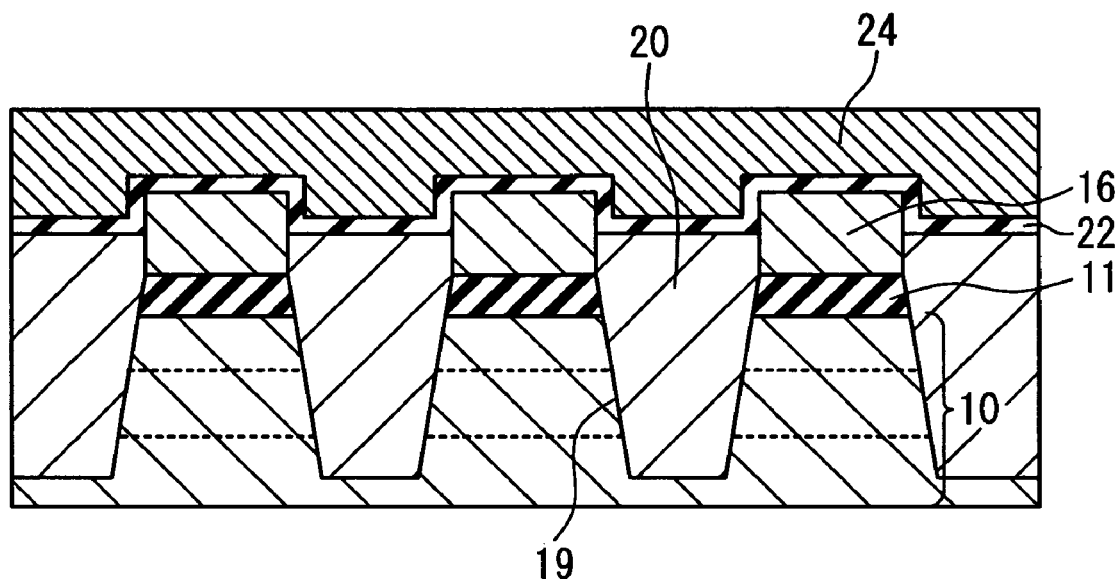
FIG. 29A is a cross sectional view of the nonvolatile memory device in the manufacturing method according to the fourth embodiment of the present invention.
Figure 29B:
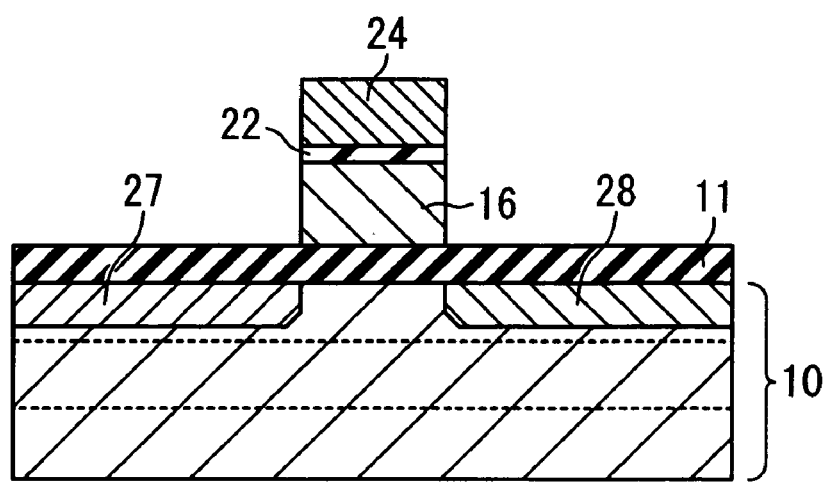
FIG. 29B is a cross sectional view of the nonvolatile memory device taken along the line A–A' in FIG. 29A.

Referring to FIGS. 29A and 29B, the N-type impurity is ion-implanted by using the polysilicon film 24 as a mask and then the source 27 and the drain 28 are formed through heat treatment.

Figure 30A:
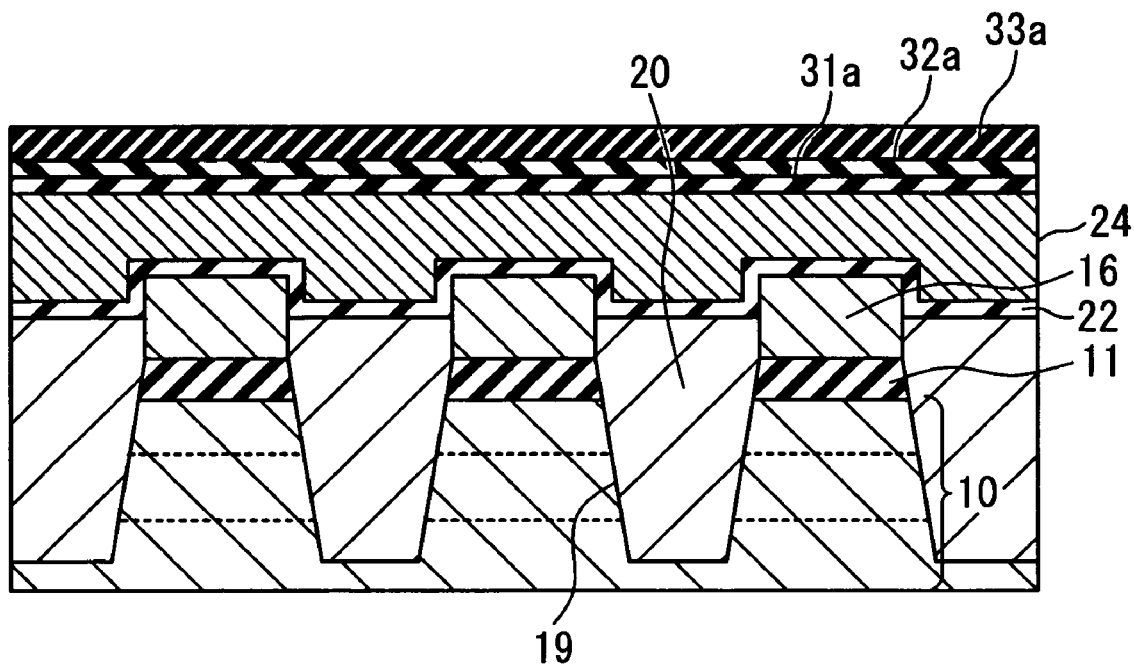
FIG. 30A is a cross sectional view of the nonvolatile memory device in the manufacturing method according to the fourth embodiment of the present invention.
Figure 30B:
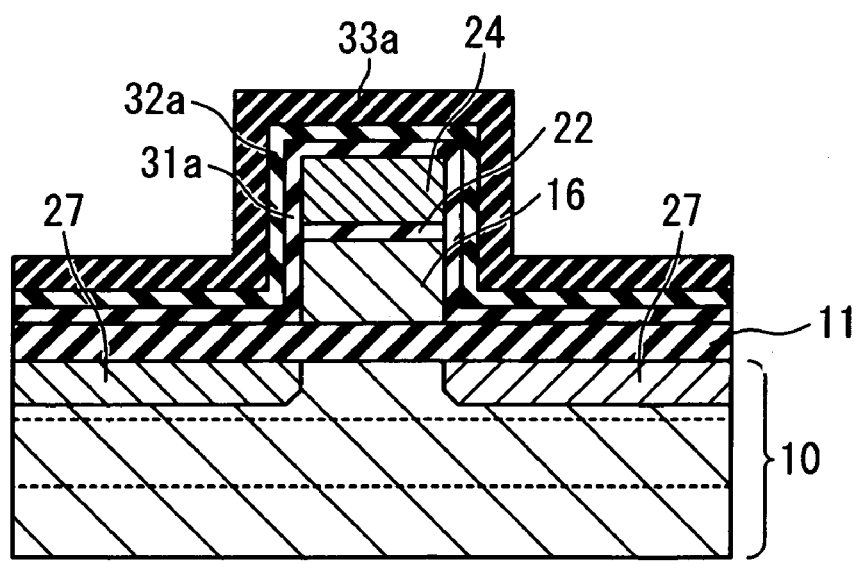
FIG. 30B is a cross sectional view of the nonvolatile memory device taken along the line A–A' in FIG. 30A.

As shown in FIGS. 30A and 30B, the silicon oxide film 31a, the silicon nitride film 32a, and the silicon oxide film 33a for a sidewall are formed by the CVD method to have the thicknesses of 10 nm, 10 nm, and 20 nm, respectively, and to cover the gate insulating film 11 and the polysilicon film 24. In this case, the above manufacturing conditions are used to have the tensile stress. Thus, it is possible to reduce the compressive stress of the channel region 8.

Figure 31A:
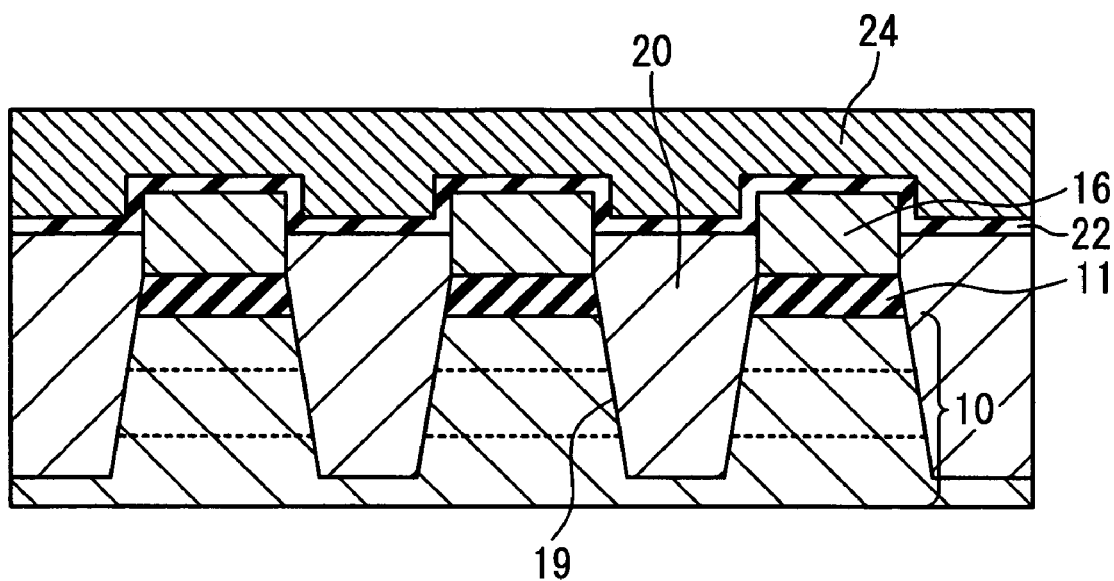
FIG. 31A is a cross sectional view of the nonvolatile memory device in the manufacturing method according to the fourth embodiment of the present invention.
Figure 31B:
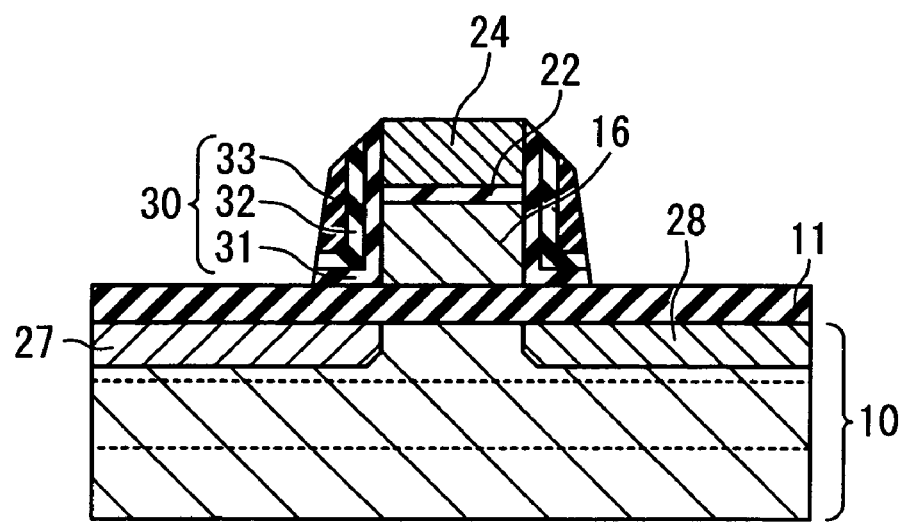
FIG. 31B is a cross sectional view of the nonvolatile memory device taken along the line A–A' in FIG. 31A.

As shown in FIGS. 31A and 31B, the sidewall 30 (the first sidewall insulating film 31, the second sidewall insulating film 32, and the third sidewall insulating film 33) is formed by the anisotropic etching.

Figure 32A:
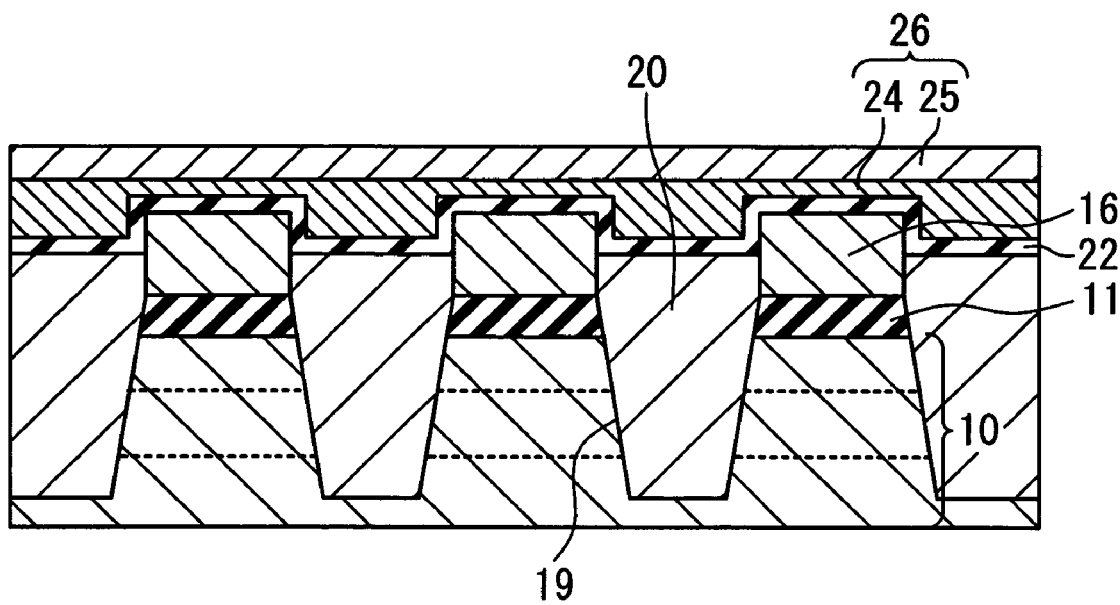
FIG. 32A is a cross sectional view of the nonvolatile memory device in the manufacturing method according to the fourth embodiment of the present invention.
Figure 32B:
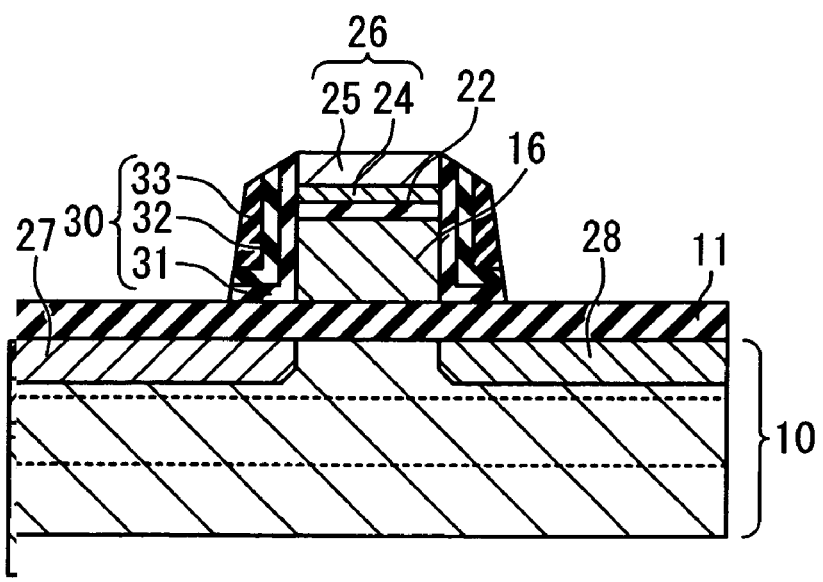
FIG. 32B is a cross sectional view of the nonvolatile memory device taken along the line A–A' in FIG. 32A.

As shown in FIGS. 32A and 32B, a Co film is formed by the sputtering method to have the thickness of 100 nm and to cover the polysilicon film 24. Subsequently, the Co film is left on the polysilicon film 24 by the techniques of photolithography and etching. Then, heat treatment is carried out so that the remained Co film reacts with the polysilicon film 24 to form a silicide film 25 of $CoSi_2$ of the thickness of 100 nm. Thus, the control gate 26 (the silicide film 25 and the polysilicon film 24) is formed.

Figure 33A:
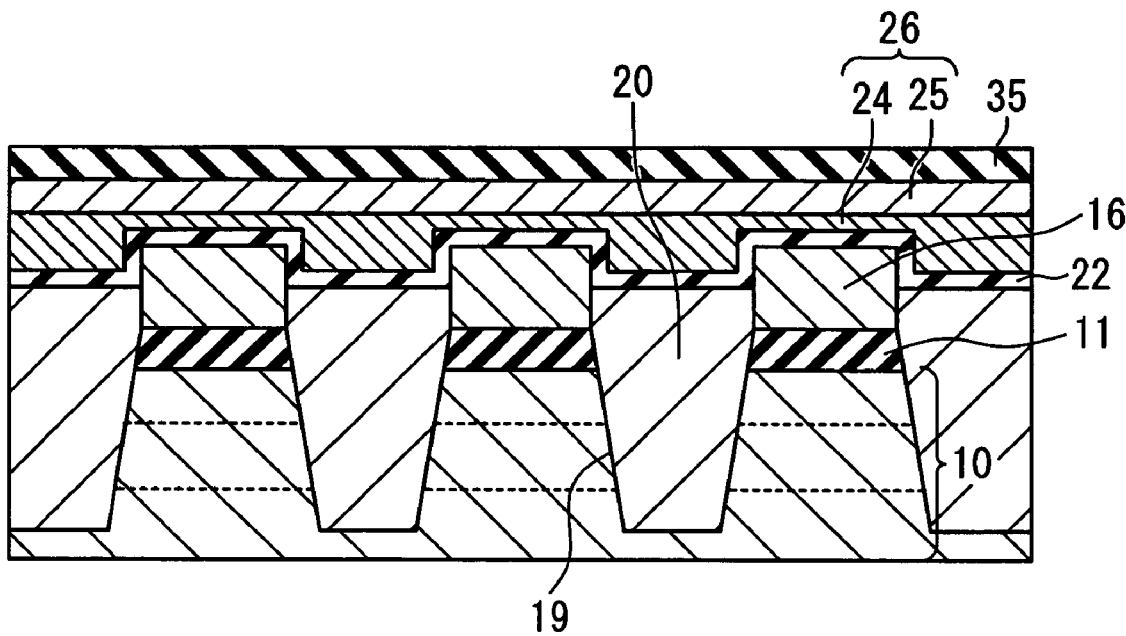
FIG. 33A is a cross sectional view of the nonvolatile memory device in the manufacturing method according to the fourth embodiment of the present invention.
Figure 33B:
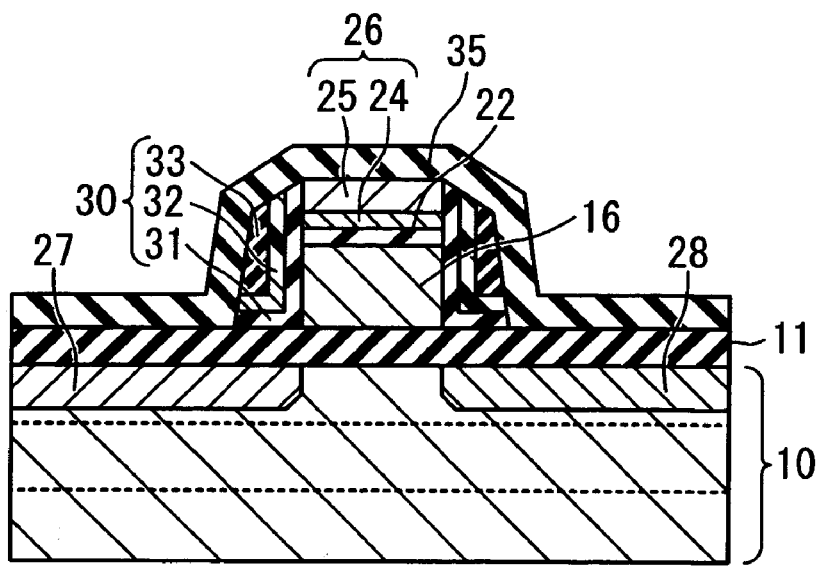
FIG. 33B is a cross sectional view of the nonvolatile memory device taken along the line A–A' in FIG. 33A.

As shown in FIGS. 33A and 33B, the interlayer insulating film 35 is formed by the CVD method to have the thickness of 200 nm and to cover the gate insulating film 11, the sidewall 30, and the control gate 26. In this case, the above manufacturing condition is used to have the tensile stress. Thus, it is possible to reduce the compressive stress of the channel region 8.

It is possible to manufacture the nonvolatile memory device having a small stress in the channel region 8 in accordance with the above manufacturing method, as shown in FIGS. 26A and 26B.

The same advantages as those of the first embodiment can be obtained also in the eighth embodiment.

The above embodiments may be applied as long as they are not contradicted mutually.

According to the present invention, it is possible to restrain the stress of a semiconductor substrate in the channel region. As a result, it is possible to increase the on/off ratio of the current of the memory cell and to restrain deterioration of the gate oxide film. Thus, it is possible to maintain the characteristic of the memory cell, to improve the number of times of the rewriting operation, and to achieve the cell characteristic suitable for a multi-valued memory.

What is claimed is:

1. A nonvolatile memory device comprising:
   source and drain regions formed in a semiconductor substrate;
   an insulating film formed on a channel region between said source region and said drain region in said semiconductor substrate;
   a dielectric film formed above said channel region to store electric charge; and
   a control gate formed on said dielectric film,
   wherein compressive stress in said channel region is equal to or less than 50 MPa.

2. The nonvolatile memory device according to claim 1, wherein tensile stress in said channel region is equal to or less than 50 MPa.

3. The nonvolatile memory device according to claim 1, wherein said control gate has a laminate structure in which a conductive semiconductor film and a metal film are laminated in this order from a side of said dielectric film.

4. The nonvolatile memory device according to claim 3, wherein said metal film contains at least a material selected from the group consisting of tungsten, tantalum, molybdenum, tungsten nitride, tantalum nitride and molybdenum nitride.

5. The nonvolatile memory device according to claim 1, wherein at least a part of said semiconductor substrate has a laminate structure in which a silicon region and a silicon germanium region are laminated in this order from a side of a surface of said semiconductor substrate.

6. The nonvolatile memory device according to claim 1, wherein at least one of said source region and said drain region contains one of a carbon added silicon region and a carbon added silicon germanium region.

7. The nonvolatile memory device according to claim 1, wherein said dielectric film comprises a semiconductor thin film.

8. The nonvolatile memory device according to claim 1, wherein said dielectric film comprises a charge storage insulating film containing electric charge trap centers.

9. The nonvolatile memory device according to claim 8, wherein said charge storage insulating film is formed of a material selected from the group consisting of silicon nitride, aluminum oxide, aluminum oxynitride, hafnium oxide, hafnium oxynitride, silicon hafnium oxide, silicon hafnium oxynitride, zirconium oxide, zirconium oxynitride, silicon zirconium oxide and silicon zirconium oxynitride.

10. The nonvolatile memory device according to claim 1, wherein said dielectric film comprises a charge storage insulating film in which semiconductor particles are dispersed.

11. The nonvolatile memory device according to claim 1, wherein said dielectric film comprises a ferroelectric film.

12. The nonvolatile memory device according to claim 1, wherein said dielectric film has a laminate structure in which a metal film and a ferroelectric film are laminated in this order from a side of said insulating film.

13. The nonvolatile memory device according to claim 1, further comprising:
    a first interlayer insulating film formed to cover said insulating film and said control gate.

14. The nonvolatile memory device according to claim 13, wherein said first interlayer insulating film has tensile stress.

15. The nonvolatile memory device according to claim 13, wherein said first interlayer insulating film is formed from at least a film selected the group consisting of a SiN film, a SiON film, a SiCN film, an AlO film and an AlSiN film.

16. The nonvolatile memory device according to claim 13, further comprising:
    sidewall insulating films formed to cover side surfaces of said dielectric film and said control gate and to contact said insulating film at a bottom portion of said sidewall insulating films,
    wherein said sidewall insulating film comprises:
    a first insulating film formed parallel to said insulating film; and
    a second insulating film parallel to said side surfaces, and
    said first insulating film has tensile stress.

17. The nonvolatile memory device according to claim 16, wherein said first insulating film contains at least one of a SiN film, a SiON film, a SiCN film, an AlO film and an AlSiN film.

18. The nonvolatile memory device according to claim 1, further comprising:
    device isolation sections formed in said semiconductor substrate.

19. The nonvolatile memory device according to claim 18, wherein said device isolation section comprises a trench groove which contains a silicon nitride film.

20. A nonvolatile memory device comprising:
    source and drain regions formed in a semiconductor substrate;
    an insulating film formed on a channel region between said source region and said drain region in said semiconductor substrate;
    a storage node formed above said channel region to store electric charge; and
    a control gate formed on said dielectric film,
    wherein compressive stress in said channel region is equal to or less than 50 Mpa.

* * * * *